(12) United States Patent
Cope

(10) Patent No.: US 11,079,997 B2
(45) Date of Patent: *Aug. 3, 2021

(54) DISPLAY APPARATUS AND METHODS

(71) Applicant: NanoLumens Acquisition, Inc, Peachtree Corners, GA (US)

(72) Inventor: Richard C. Cope, Duluth, GA (US)

(73) Assignee: NanLumens Acquisition, Inc., Peachtree Corners, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/812,422

(22) Filed: Mar. 9, 2020

(65) Prior Publication Data
US 2020/0210134 A1 Jul. 2, 2020

Related U.S. Application Data

(63) Continuation of application No. 16/192,231, filed on Nov. 15, 2018, now Pat. No. 10,585,635, which is a
(Continued)

(51) Int. Cl.
G06F 3/14 (2006.01)
G09F 9/30 (2006.01)
(Continued)

(52) U.S. Cl.
CPC .......... *G06F 3/1446* (2013.01); *C23C 14/562* (2013.01); *G06F 3/1438* (2013.01);
(Continued)

(58) Field of Classification Search
CPC ........ G06F 3/1446; G06F 3/1438; G09F 9/30; G09F 9/301; G09F 9/33; C23C 14/562; G09G 3/2088; G09G 3/20; G09G 3/32; G09G 2300/026; G09G 2300/04; G09G 2300/046; G09G 2300/0452; G09G 2320/0626; G09G 2380/02; G09G 2380/06; H01L 23/2088; H01L 25/0655; H01L 25/0753; H01L 31/03923; H01L 31/206; H01L 33/20; H01L 33/48; H01L 33/483; H01L 27/153; H01L 33/02; H01L 2252/5338; H01L 2924/0002; H01L 2933/0033; Y02P 70/50; B05D 3/0493; B05D 2252/02; Y03E 10/541
See application file for complete search history.

(56) References Cited

U.S. PATENT DOCUMENTS 5,164,853 A 11/1992 Shimazaki
5,747,928 A 5/1998 Shanks et al.
(Continued)

*Primary Examiner* — Andrew L Sniezek
(74) *Attorney, Agent, or Firm* — Troutman Pepper Hamilton Sanders LLP

(57) ABSTRACT

A display includes a plurality of pixel chips, chixels, provided on a substrate. The chixels and the light emitters thereon may be shaped, sized and arranged to minimize chixel, pixel, and sub-pixel gaps and to provide a seamless look between adjacent display modules. The substrate may include light manipulators, such as filters, light converters and the like to manipulate the light emitted from light emitters of the chixels. The light manipulators may be arranged to minimize chixel gaps between adjacent chixels.

20 Claims, 16 Drawing Sheets

Related U.S. Application Data continuation of application No. 15/806,988, filed on Nov. 8, 2017, now Pat. No. 10,134,715, which is a continuation of application No. 15/497,330, filed on Apr. 26, 2017, now Pat. No. 9,831,223, which is a continuation of application No. 14/878,041, filed on Oct. 8, 2015, now Pat. No. 9,640,516, which is a continuation of application No. 14/678,435, filed on Apr. 3, 2015, now Pat. No. 9,159,707, which is a continuation of application No. 12/348,158, filed on Jan. 2, 2009, now Pat. No. 9,013,367.

(60) Provisional application No. 61/019,144, filed on Jan. 4, 2008.

(51) Int. Cl.

| | | |
|---|---|---|
| *G09G 3/20* | (2006.01) | |
| *C23C 14/56* | (2006.01) | |
| *H01L 31/0392* | (2006.01) | |
| *H01L 31/20* | (2006.01) | |
| *G09F 9/33* | (2006.01) | |
| *H01L 25/075* | (2006.01) | |
| *H01L 33/20* | (2010.01) | |
| *H01L 33/48* | (2010.01) | |
| *H01L 23/498* | (2006.01) | |
| *H01L 25/065* | (2006.01) | |
| *G09G 3/32* | (2016.01) | |
| *B05D 3/04* | (2006.01) | |
| *H01L 27/15* | (2006.01) | |
| *H01L 33/32* | (2010.01) | |

(52) U.S. Cl.
CPC ............... *G09F 9/30* (2013.01); *G09F 9/301* (2013.01); *G09F 9/33* (2013.01); *G09G 3/2088* (2013.01); *H01L 23/4985* (2013.01); *H01L 25/0655* (2013.01); *H01L 25/0753* (2013.01); *H01L 31/03923* (2013.01); *H01L 31/206* (2013.01); *H01L 33/20* (2013.01); *H01L 33/48* (2013.01); *H01L 33/483* (2013.01); *B05D 3/0493* (2013.01); *B05D 2252/02* (2013.01); *G09G 3/20* (2013.01); *G09G 3/32* (2013.01); *G09G 2300/026* (2013.01); *G09G 2300/04* (2013.01); *G09G 2300/0426* (2013.01); *G09G 2300/0452* (2013.01); *G09G 2320/0626* (2013.01); *G09G 2380/02* (2013.01); *G09G 2380/06* (2013.01); *H01L 27/153* (2013.01); *H01L 33/32* (2013.01); *H01L 2251/5338* (2013.01); *H01L 2924/0002* (2013.01); *H01L 2933/0033* (2013.01); *Y02E 10/541* (2013.01); *Y02P 70/50* (2015.11)

(56) References Cited

U.S. PATENT DOCUMENTS

| | | | |
|---|---|---|---|
| 5,786,988 A | * | 7/1998 | Harari .............. G06K 19/07728 235/487 |
| 6,228,228 B1 | * | 5/2001 | Singh ...................... G09F 9/305 204/192.1 |
| 6,332,690 B1 | | 12/2001 | Murofushi |
| 6,819,045 B2 | | 11/2004 | Okita et al. |
| 6,974,971 B2 | | 12/2005 | Young |
| 7,242,398 B2 | | 7/2007 | Nathan et al. |
| 7,615,920 B2 | | 11/2009 | Choo |
| 7,636,085 B2 | | 12/2009 | Yang |
| 7,710,370 B2 | | 5/2010 | Slikkerveer et al. |
| 7,714,801 B2 | | 5/2010 | Kimmel |
| 7,825,582 B2 | | 11/2010 | Furukawa et al. |
| 7,834,537 B2 | | 11/2010 | Kee et al. |
| 7,834,962 B2 | | 11/2010 | Satake et al. |
| 7,868,545 B2 | | 1/2011 | Hioki et al. |
| 7,977,170 B2 | | 7/2011 | Tredwell et al. |
| 8,023,060 B2 | | 9/2011 | Lin et al. |
| 8,096,068 B2 | | 1/2012 | Van Rens |
| 8,097,812 B2 | | 1/2012 | Wang et al. |
| 8,098,486 B2 | | 1/2012 | Hsiao |
| 8,228,667 B2 | | 7/2012 | Ma |
| 8,284,369 B2 | | 10/2012 | Chida et al. |
| 8,319,725 B2 | | 11/2012 | Okamoto et al. |
| 8,456,078 B2 | | 6/2013 | Hashimoto |
| 8,471,995 B2 | | 6/2013 | Tseng |
| 8,477,464 B2 | | 7/2013 | Visser et al. |
| 8,493,520 B2 | | 7/2013 | Gay et al. |
| 8,493,726 B2 | | 7/2013 | Visser et al. |
| 8,654,519 B2 | | 2/2014 | Visser |
| 8,780,039 B2 | | 7/2014 | Gay et al. |
| 8,780,088 B2 | | 7/2014 | Boer |
| 8,816,977 B2 | | 8/2014 | Rothkopf et al. |
| 8,873,225 B2 | | 10/2014 | Huitema et al. |
| 8,982,545 B2 | | 3/2015 | Kim et al. |
| 9,117,384 B2 | | 8/2015 | Phillips et al. |
| 9,176,535 B2 | | 11/2015 | Bohn et al. |
| 9,286,812 B2 | | 3/2016 | Bohn et al. |
| 9,335,793 B2 | | 5/2016 | Rothkopf |
| 9,372,508 B2 | | 6/2016 | Wang |
| 9,459,656 B2 | | 10/2016 | Shai |
| 9,640,516 B2 | | 5/2017 | Cope |
| 2006/0044215 A1 | | 3/2006 | Brody et al. |
| 2006/0098153 A1 | | 5/2006 | Slikkerveer et al. |
| 2006/0170332 A1 | | 8/2006 | Tamaki |
| 2006/0204675 A1 | | 9/2006 | Gao et al. |
| 2007/0001927 A1 | | 1/2007 | Ricks et al. |
| 2007/0241002 A1 | | 10/2007 | Wu et al. |
| 2008/0042940 A1 | | 2/2008 | Hasegawa |
| 2008/0218369 A1 | | 9/2008 | Krans et al. |
| 2009/0033856 A1 | | 2/2009 | Kiryuschev et al. |
| 2009/0189917 A1 | | 7/2009 | Benko et al. |
| 2011/0134144 A1 | | 6/2011 | Moriwaki |
| 2012/0002360 A1 | | 1/2012 | Seo et al. |
| 2012/0092363 A1 | | 4/2012 | Kim et al. |
| 2012/0313862 A1 | | 12/2012 | Ko et al. |
| 2013/0100392 A1 | | 4/2013 | Fukushima |

* cited by examiner

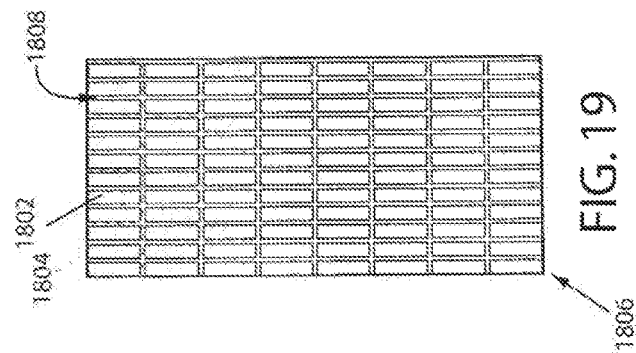
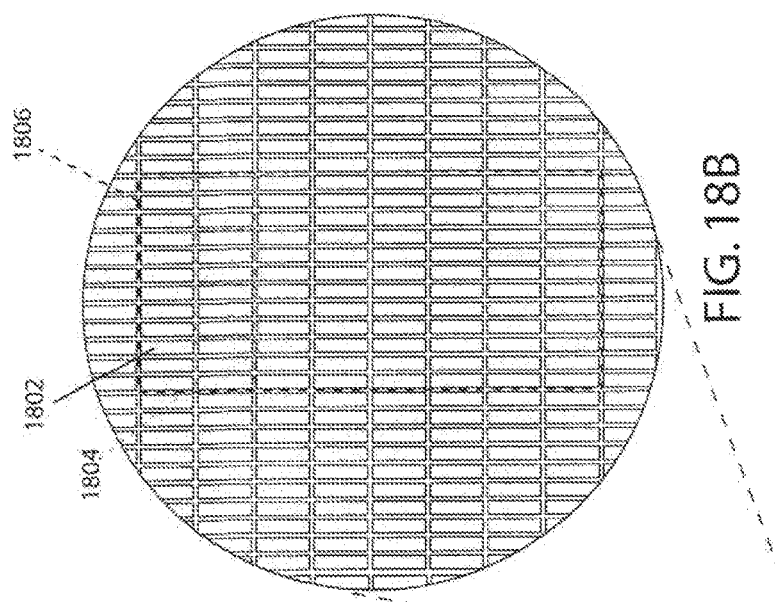
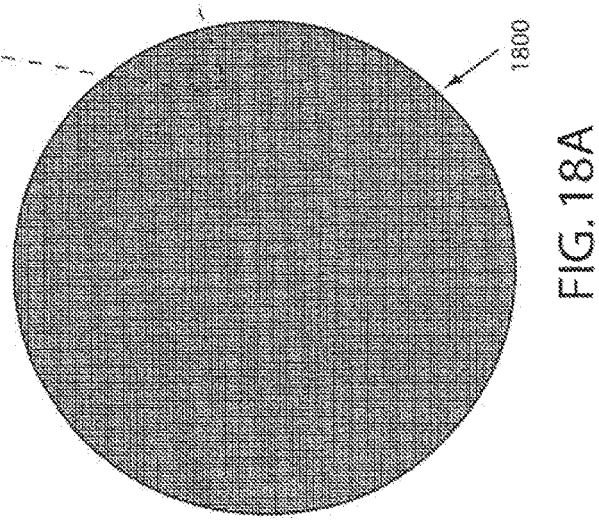

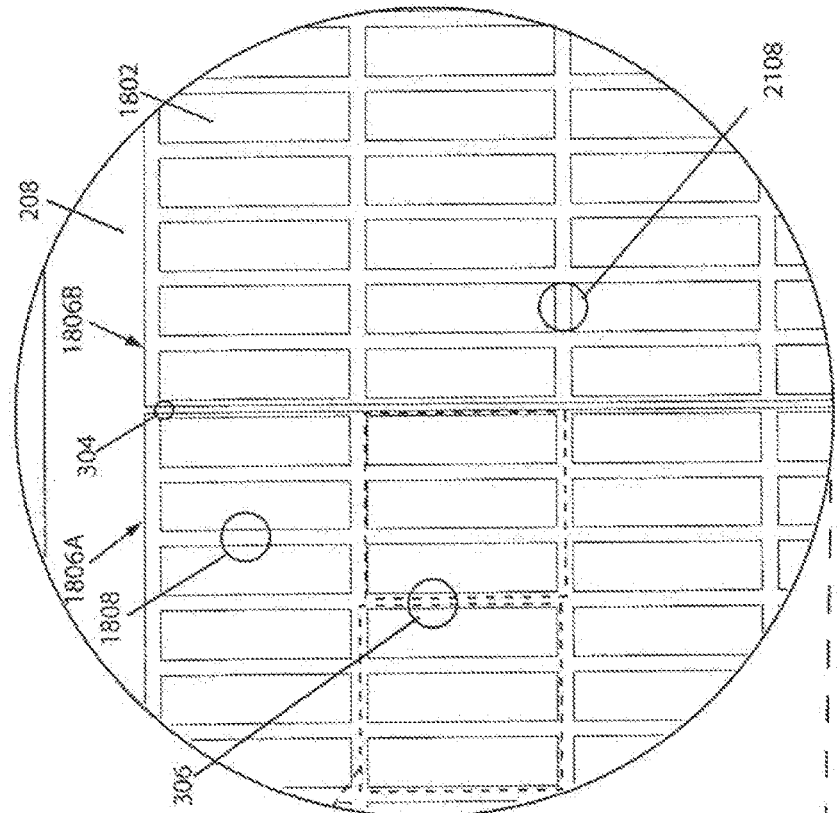
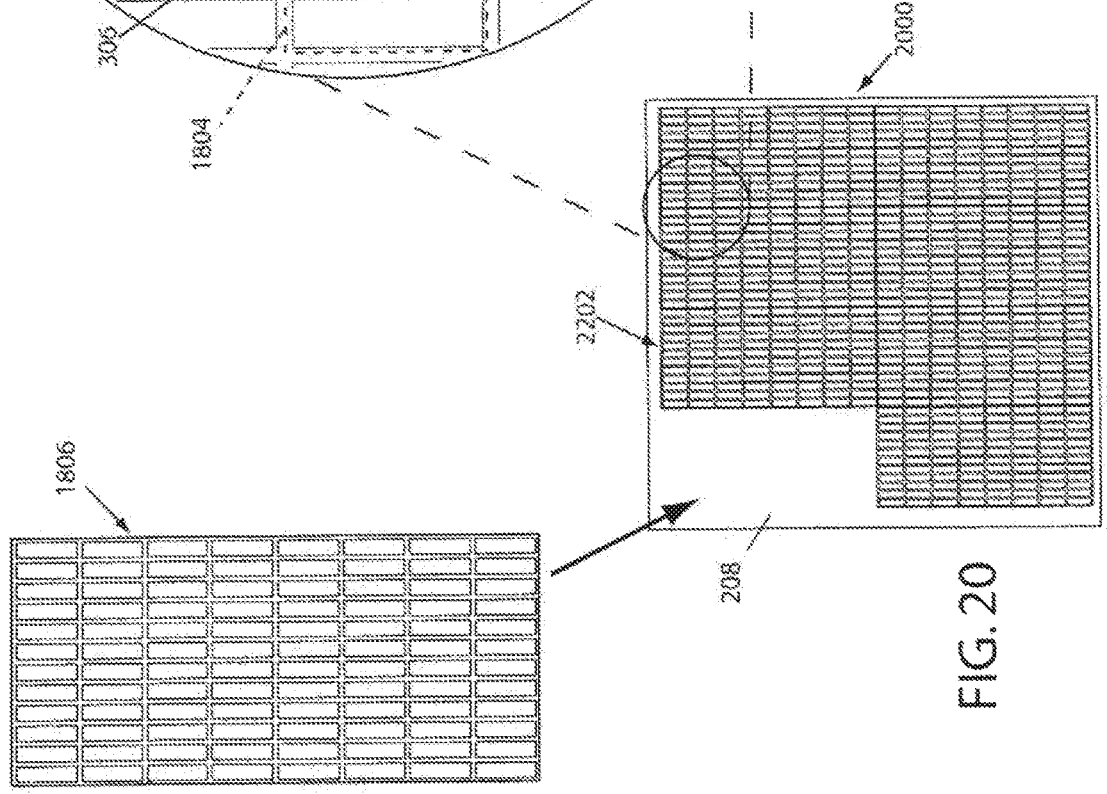
FIG. 20
FIG. 21

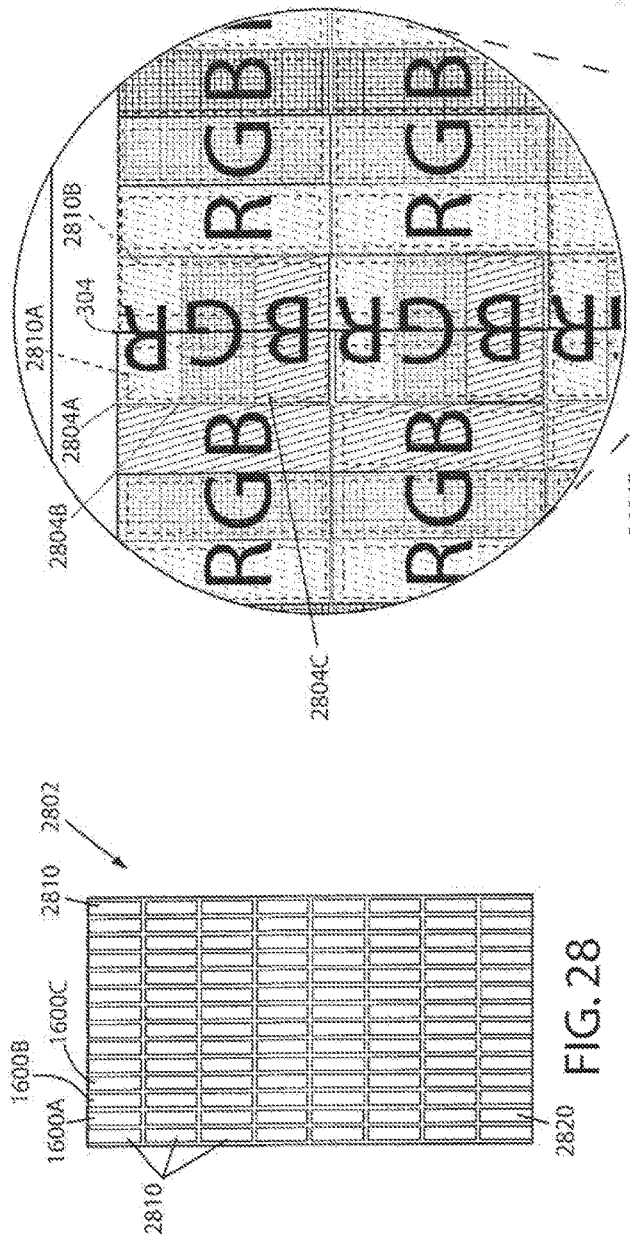
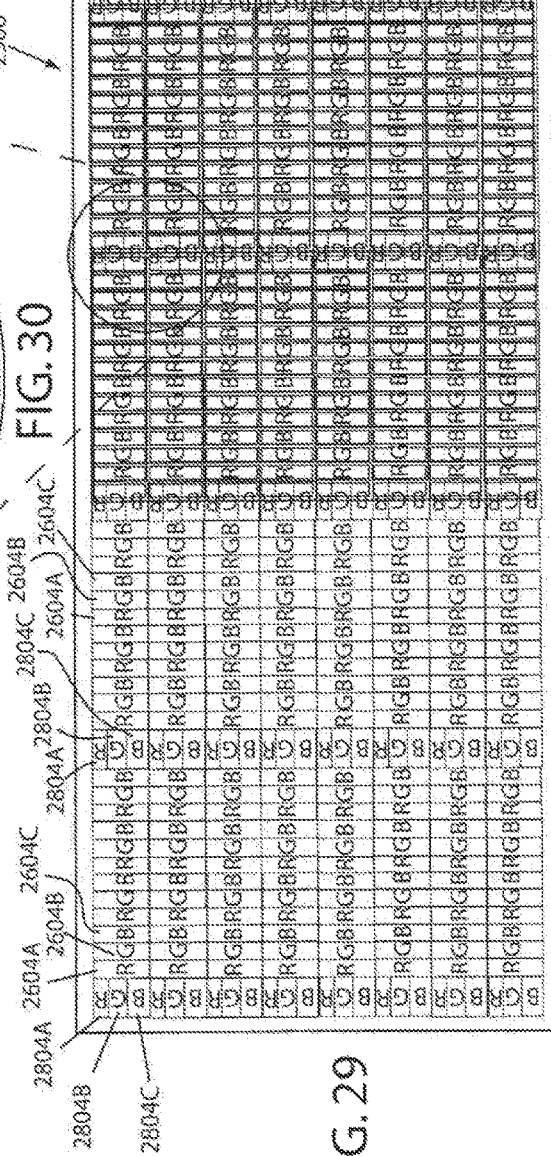
FIG. 28
FIG. 29
FIG. 30

DISPLAY APPARATUS AND METHODS

CROSS REFERENCE TO RELATED APPLICATIONS

This non-provisional utility application is a continuation of and claims priority to application Ser. No. 16/192,231 filed Nov. 15, 2018. Application Ser. No. 16/192,231 is a continuation of and claims priority to application Ser. No. 15/806,988 filed Nov. 8, 2017 application Ser. No. 15/806,988 is a continuation of non-provisional utility application Ser. No. 15/497,330 filed Apr. 26, 2017. Application Ser. No. 15/497,330 is a continuation of non-provisional utility application Ser. No. 14/878,041 filed on Oct. 8, 2015. Application Ser. No. 14/878,041 is a continuation of non-provisional utility application Ser. No. 14/678,435 filed on Apr. 3, 2015, now U.S. Pat. No. 9,159,707. Application Ser. No. 14/678,435 is a continuation of non-provisional utility application Ser. No. 12/348,158 filed on Jan. 2, 2009, now U.S. Pat. No. 9,013,367. Application Ser. No. 12/348,158 is a non-provisional of U.S. provisional Application No. 61/019,144 filed Jan. 4, 2008. Application Ser. No. 15/806,988, application Ser. No. 15/497,330, application Ser. No. 14/878,041, application Ser. No. 14/678,435, application Ser. No. 12/348,158 and Application No. 61/019,144 are incorporated herein by reference.

FIELD OF INVENTION

The present invention relates to display devices. More particularly, the present invention comprises a flexible display.

BACKGROUND

There has been increased interest in the development of flexible displays. It has proven difficult, however, to produce a large flexible display, as manufacturing techniques used to produce small-scale displays have not proven readily scalable. Presently, large scale displays tend to be heavy, expensive, non-flexible, unreliable and power hungry.

SUMMARY OF THE INVENTION

In one exemplary embodiment, a flexible display includes a plurality of self-contained pixel-containing chips, called chixels, that are arranged on a flexible substrate in a manner that provides sufficient bend radius to the substrate to allow flexing of the display. The chixels may include a sub-array of pixels provided on a rigid substrate that may be scaled to form a modular unit. A chixel can be combined with other chixels on a flexible substrate so that multiple pixel sub-arrays combine to form a large pixel array for a display. The chixels may be rigid units of a predetermined size and shape and arranged on the display substrate in a manner to provide a desired bend radius to the substrate and produce a display having a desired degree of flexibility.

The flexibility of the chixel display is a function of the bend gaps between the chixels. As used herein the term "bend gap" refers to the space between adjacent chixels. Generally, the smaller the chixels, the greater number of bend gaps and the more flexible the display. A chixel may be formed in a particular shape and arranged on a flexible substrate in such a way as to provide a chixel-based display of a desired flexibility. For example, a chixel may be square-shaped and have an n×n pixel arrangement, such as a 4×4 arrangement, to allow similar flexibility in both the horizontal and vertical planes. To increase flexibility in one particular plane more than another, the size of the chixel in that particular plane may be decreased to provide more bending points. For example, a pixel arrangement including elongated rectangular-shaped chixels having a 4-row×8-column pixel arrangement thereon may provide twice as many vertical gaps as horizontal gaps and thereby provide greater lateral flexibility. Furthermore, chixels of different sizes or shapes may be incorporated into a display to customize the flexibility of different portions of the display.

In an exemplary embodiment of a chixel, a plurality of light emitters is provided on a rigid substrate and serves as sub-pixels of a display. The sub-pixels may be divided into groupings, such as groupings of three sub-pixels, to form pixels. For example, sub-pixels that emit red, green and blue light may be grouped together to form an RGB pixel. Other arrangements, such as by way of example and not limitation, include a mono-color display in which all sub-pixels or pixels emit the same color light. Additionally, the light emitted by the pixels or sub-pixels may be converted or filtered to provide the desired light output; for example, the pixels could be formed of blue LEDs that are filtered or are color converted and filtered.

The sub-pixels may be of rectangular shape so that when combined with other sub-pixels they form a square pixel. For example, each sub-pixel may be of a size ⅓x×x, so that three sub-pixels placed side-by-side form a square pixel of size x×x. The pixels may be arranged on the substrate such that the space between adjacent pixels, referred to herein as a "pixel gap," is of a desired distance d1. Because there are no pixels to produce light at the pixel gap, the gap may appear as a darkened area of a display, referred to as a "pixel gap line." Similarly, the sub-pixels may be uniformly spaced so that space between sub-pixels, the "sub-pixel gap", is of a desired size.

In one aspect of the invention, the pixels are of a size relative to the pixel gap to make the pixel gap line less noticeable to a viewer. For example, the pixels may be of a size relative to the size of the pixel gap so as to provide a display of a desired resolution in which the pixel gap is not as pronounced or distracting to the viewer. This relationship and sizing may depend on a number of factors, including, but not limited to, viewing distance, contrast ratio, brightness, and viewing environment.

As mentioned above, the chixels are provided on the flexible display substrate adjacent other chixels. The distance between the chixels is referred to herein as a "chixel gap." In an exemplary embodiment the chixels are arranged so that the chixel gap is minimized and the "pixel gap" between adjacent pixels is uniform throughout the display, even across adjacent chixels. In another exemplary embodiment the sub-pixel gaps are uniform within a chixel as well as between adjacent chixels.

The sub-pixels and pixels of the chixels may comprise various light emitters. In one exemplary embodiment, a chixel comprises sub-pixels and pixels formed of light emitted diodes (LEDs). In an exemplary method of making an LED-based chixel, a plurality of LEDs is prepared on a rigid substrate. For example, an n-doped layer and a p-doped layer are provided on a rigid substrate, such as glass or sapphire wafer to form LED layers. Various layers may be used in the LED manufacturing process to produce LEDs which emit light with desired properties. For example, various phosphor layers may be used to produce light of desired wavelengths and color. These layers may be provided to the bottom of the substrate. For example, a photo-conversion layer may be provided on the bottom of the rigid substrate to convert blue emitted light into white light which is more efficiently filtered to different colors. In one exemplary embodiment of the invention, a light manipulator may be added. For example, filters made of co-extruded polycarbonate plastics, surface coated plastics, or deep dyed polyesters may be provided to convert the light emitted from the LEDs to a light with desired characteristics. For example, most filters are subtractive, allowing only a portion of the emitted light to pass through the filter. For example, filters and color conversion techniques may be used to provide light of desired properties. For example, filters may be used to produce red and green light from emitted blue light. The dyes for the filters may be optimized to produce the desired wavelength of light output from the light emitted from the LED. A color conversion phosphor may be deposited over the blue LEDs to produce a white light emission that may then be filtered into desired colors, such as red, blue, and green. The filter film could be provided to the chixel or to the flexible substrate to which the chixels are attached.

Portions of the LED layers may then be removed by etching or other known techniques to form a plurality of spaced-apart LED stacks that share the same substrate. For example, portions of the LED layers could be removed down to the rigid substrate so as to provide LED stacks that share the same substrate. The particular size of the LED stacks can vary according to the use of the display. For example, for displays meant for close viewing the LEDs can be etched into smaller stacks than displays meant for viewing at greater distances.

Contacts may then be provided to the LED stacks to form a plurality of spaced apart LEDs on a rigid substrate that together form an LED wafer. The LEDs may be provided with rear contacts so that rear display drivers may be used to drive the display in which the chixels are incorporated. For example, a portion of the p-doped layer of the LED stack may be removed ex pose the n-doped layer in order to provide an n-contact area at the top end of the LED stack. This allows for conductor wires to the contact to extend upwardly from the display and diminishes the need for space between LEDs for the contact. A p-contact may also be provided at the top of the stack to form a rear-drivable LED.

The LED wafer may then be subdivided into smaller portions that define chixels, each chixel having a plurality of LEDs that will serve as sub-pixels. The chixels can then be placed on a flexible substrate in an arrangement that allows bending between the chixels and provided with drive means to form a flexible display. This manufacturing process allows for accurate spacing between the LEDs by using masking, etching or other known techniques that produce uniformly spaced sub-pixels. Furthermore, the process allows for the accurate arrangement of sub-pixels between chixels and, therefore, uniform sub-pixel placement throughout a display as well as minimal sub-pixel, pixel, and chixel gaps.

Traditionally an LED wafer is diced into individual LEDs that are then housed in separated LED assemblies. These separate LED assemblies are then incorporated into a display as individual sub-pixels. Due to the individual housings of the LEDs, however, that method results in displays with non-uniform sub-pixel or pixel spacing and large sub-pixel gaps and pixel gaps. Furthermore, each individual LED must be provided separately into the display, resulting in a large number of manufacturing operations.

Chixels may be formed by halting an LED wafer production process before the substrate is diced to form discrete LEDs. In a typical process for producing blue emitting LEDs, a layer of p-doped gallium nitride is deposited on a 2" sapphire wafer. Then, a layer of n-doped gallium nitride is deposited. A photo-mask is deposited and the gallium nitride layers are selectively photo-etched to create individual LED units and their respective electrodes. In the manufacture of discrete LEDs, the wafer would then be diced, and the LEDs would be packaged. In the chixel production process, the wafer is diced, but instead of discrete LEDs, the dicing is performed so that the resulting diced pieces hold x×x arrays of LEDs.

Under an exemplary method of the present invention, multiple LEDs share a single LED substrate by cutting the LED wafer into larger units, chixels, that comprise a plurality of LEDs that define sub-pixels and together form pixels of a display. This allows for uniform spacing between the LEDs, and therefore uniform spacing between sub-pixels and pixels and results in smaller sub-pixel and pixel gaps. By manufacturing the LEDs on the same rigid wafer substrate, the pitch of the LEDs can be tightly controlled during the LED wafer manufacturing process using masking, etching and other techniques thereby providing a uniform sub-pixel and pixel pitch. The LEDs may be provided with contacts and a drive means to form workable sub-pixels of a display.

Furthermore, the exemplary method allows for different chixel sizes and shapes to be selected during the dicing process and is easily adjustable to different sub-pixel sizes by changing the etching process. For example, an LED wafer may be grown having LEDs of a size 320 microns square and separated by 320 microns on each side and then separated into sub-units of 96 LEDs, each LED corresponding to a sub-pixel of a display. For example, the 96 LEDs may correspond to 8 rows of 12 sub-pixels. The sub-pixels may be grouped into three to define pixels to form a 4×8 pixel arrangement. Or the LED wafer may be divided into chixels having 48 LED sub-pixels to form a 4×4 pixel arrangement. The sub-pixel size can be changed by simply using a different etching mask and the chixel size by changing the dicing cut lines.

A plurality of chixels, having a plurality of light emitters, which will serve as sub-pixels of a display, may be arranged on a flexible substrate to produce a flexible display. In one exemplary method the chixels are placed light-emitting end down onto a flexible substrate so as to transmit light through the flexible substrate. The chixels may be arranged at a predetermined spacing to produce a desired chixel gap to provide a desired bend radius to the flexible substrate. Drive means may be provided to the chixels to power the light emitters for emitting light. The drive means may include a controller to control the light emitted from each light emitter (sub-pixel) to produce a desired image on the display. In one exemplary embodiment a controller is provided for each chixel to produce a chixel-partitioned display. This has the advantage of decreasing the number and length of wires and distributes the size of the controller unit out among the chixels, possibly reducing the bulk of the display electronics by subdividing them into smaller, though more numerous, units.

In one exemplary embodiment a flexible substrate that may be used in conjunction with the chixels includes a diffusion layer, a contrast enhancement layer, and a hardened outer layer. The chixels may be attached to the flexible substrate by an adhesive or other means so that light emitted from the chixel is transmitted through the flexible substrate. The flexible substrate may also include one or more filters to manipulate the light emitted from the LEDs. For example, the substrate may include an arrangement of red, green and blue filters that correspond to the location of light emitters of the chixels to provide red, green and blue sub-pixels of the display.

It is possible to produce an RGB display using monocolor LEDs and either filters or color conversion and filters. Both techniques use blue (gallium nitride, GaN) LEDs. In the first embodiment, blue LEDs may be filtered to allow only red or green wavelengths of light to be emitted. In this case, the blue would not be further filtered for blue light emission unless it was desirable to emit a different color point. In the second embodiment, a white color conversion phosphor is deposited over the blue LEDs. This results in white light emission that can then be filtered into red, green and blue. The filtering of white to RGB is more efficient than the filtering of blue to red or green. The filters used in these embodiments could be provided in the form of a flexible film onto which the appropriate dyes and/or filter materials have been printed in the desired pattern. An example of this type of film is that used 011 backlit LCD laptop monitors. In an effort to make the chixel gap less noticeable to the viewer, the filter film area corresponding to the edge of a chixel may be printed with the pixel shape rotated 900, and LEDs from both adjacent chixels will light the rotated pixel.

In one exemplary embodiment, in which blue LEDs are used, red and green filters may be provided 10 make RGB pixels. As discussed above, the LEDs of the chixel may include a photo-conversion layer so that the LEDs emit white light, in which case red, green, and blue filters may be used. Arrangements other than standard RGB pattern may be used. For example, in one exemplary embodiment, filters are arranged to minimize the sub-pixel, pixel, and chixel gap by providing filters that bridge two adjacent chixels. For example, a red filter may be placed so as to cover sub-pixels from two different chixels. Furthermore, although discussed as one light emitter to one sub-pixel, multiple light emitters may be used for one sub-pixel. For example, each colored filter may include three LEDs.

BRIEF DESCRIPTION OF THE DRAWINGS

FIG. 18A shows a top view of an LED wafer in accordance with an exemplary embodiment of the invention.

FIG. 18B shows an enlarged portion of the LED wafer of FIG. 18A.

FIG. 19 shows a chixel separated from the LED wafer of FIG. 18A in accordance with an exemplary embodiment of the invention.

FIG. 20 shows the chixel of FIG. 19 incorporated into a display.

FIG. 21 sows an enlarged portion of the display of FIG. 20.

FIG. 28 shows an exemplary embodiment of a chixel having additional edge light emitters.

FIG. 29 shows a color flexible chixel-based display incorporating the chixel of FIG. 28.

FIG. 30 shows an enlarged portion of the display of FIG. 29.

DETAILED DESCRIPTION

As required, exemplary embodiments of the present invention are disclosed herein. These embodiments are meant to be examples of various ways of implementing the invention and it will be understood that the invention may be embodied in alternative forms. The figures are not to scale and some features may be exaggerated or minimized to show details of particular elements, while related elements may have been eliminated to prevent obscuring novel aspects. Therefore, specific structural and functional details disclosed herein are not to be interpreted as limiting, but merely as a basis for the claims and as a representative basis for teaching one skilled in the art to variously employ the present invention.

For purposes of teaching and not limitation, the exemplary embodiments disclosed here in are discussed mainly in the context of LED light emitter technologies. However, the present invention is applicable to other light emitting technologies as well, such as, by way of example and not limitation, backlit LEDs, electro-luminescence, or plasma tubes or cells.

Figure 1:
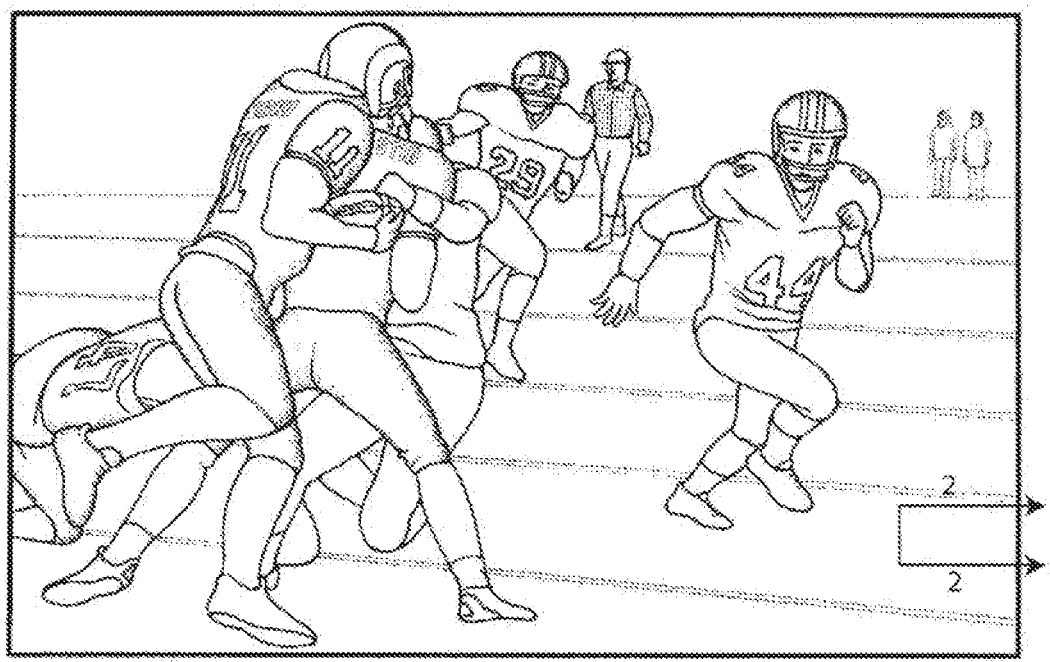
FIG. 1 shows a flexible display in accordance with an exemplary embodiment of the invention.
Figure 2:
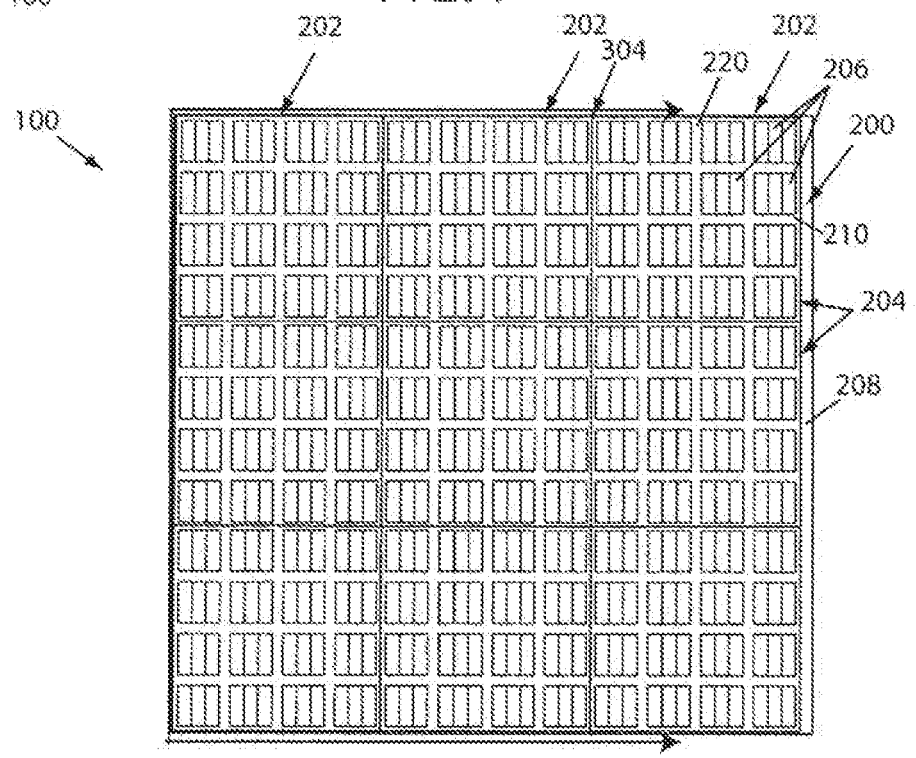
FIG. 2 shows an enlarged view of a portion of the display of FIG. 1 along cut line 2-2.

Turning to the figures where like elements have like reference numbers throughout the several views, FIG. 1 shows an exemplary embodiment of a flexible display 100. As shown in FIG. 2, the flexible display 100 is comprised of a plurality of pixel chips 202, referred to herein as chixels 202, that are arranged in a chixel arrangement 200. The chixels 202 may be rigid self-contained components that include a plurality of pixels 204, formed of sub-pixels 206. The chixels 202 are of a sufficiently small size and attached to a flexible display substrate 208 in such a manner that the space between the chixels, referred to herein as a chixel gap 304, allows the flexible display substrate 208 to have a bending radius to provide a desired flexibility to the display 100.

Figure 3A:
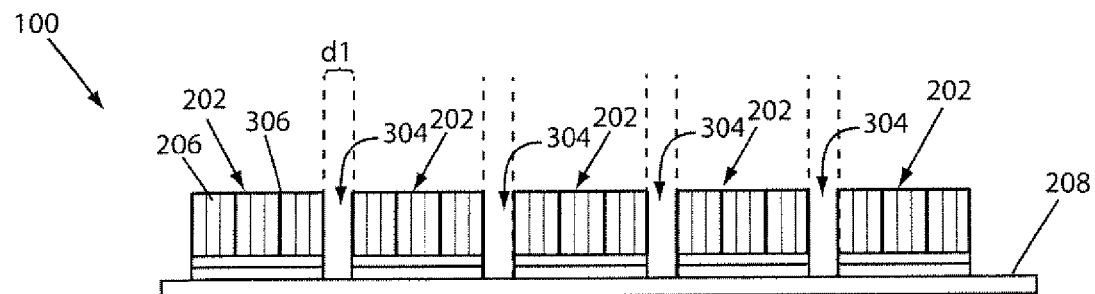
FIGS. 3A-3B show a side view of a flexible chixel display in accordance with an exemplary embodiment of the invention.
Figure 3B:
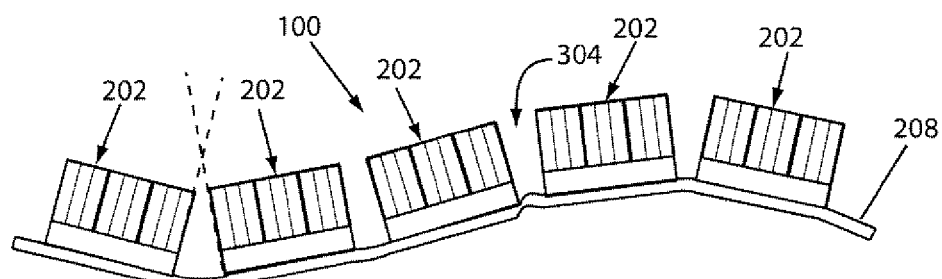

For example, as shown in FIG. 3A, chixels 202 are provided on a flexible display substrate 208 with a chixel gap 304 of a size so that the side edges of the chixels are parallel when the substrate 208 is flat. As shown in FIG. 3B, as the substrate 208 flexes, the chixels 202 move at angles with respect to one another due to the bending of the substrate 208 at the chixel gaps 304. Although shown as square chixels 202 with sharp upper corners, the chixels 202 could have rounded corners or other shapes to prevent contact between adjacent chixels 202 during bending of the substrate 208. Furthermore, the chixels 202 could be shaped so as to limit or prevent flexing of the substrate in a particular direction. For example, the chixels could have extensions (not shown) that contact each other to limit movement when the display is flexed in a particular direction. The size of the chixels and spacing between the chixels could also be varied to provide desired flexibility. For example, smaller chixels could be used on portions of the display which require more flexibility and larger chixels used on portions with lower flexibility requirements.

The chixels 202 are of a predetermined shape and arranged in a desired pattern on a flexible substrate 208 to form a flexible display 100. The size, shape, and arrangement of the chixels 202 may be selected to provide a desired bend radius to the flexible substrate 208 to which the chixels 202 are incorporated.

Figure 4:
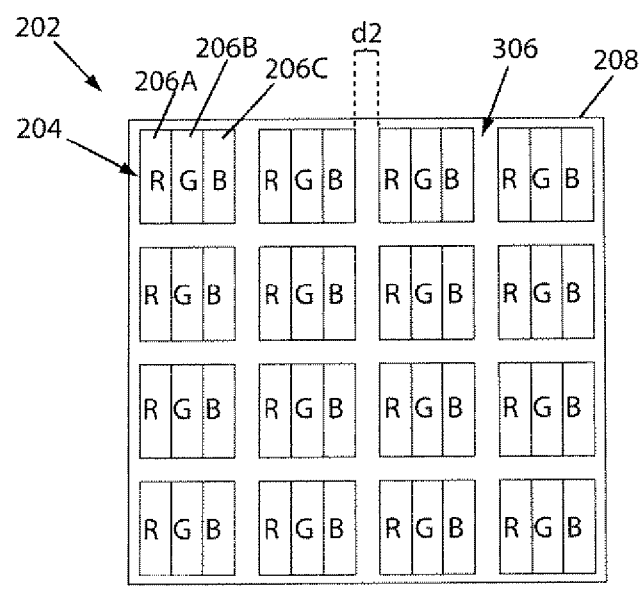
FIG. 4 shows a chixel in accordance with an exemplary embodiment of the invention.
Figure 5:
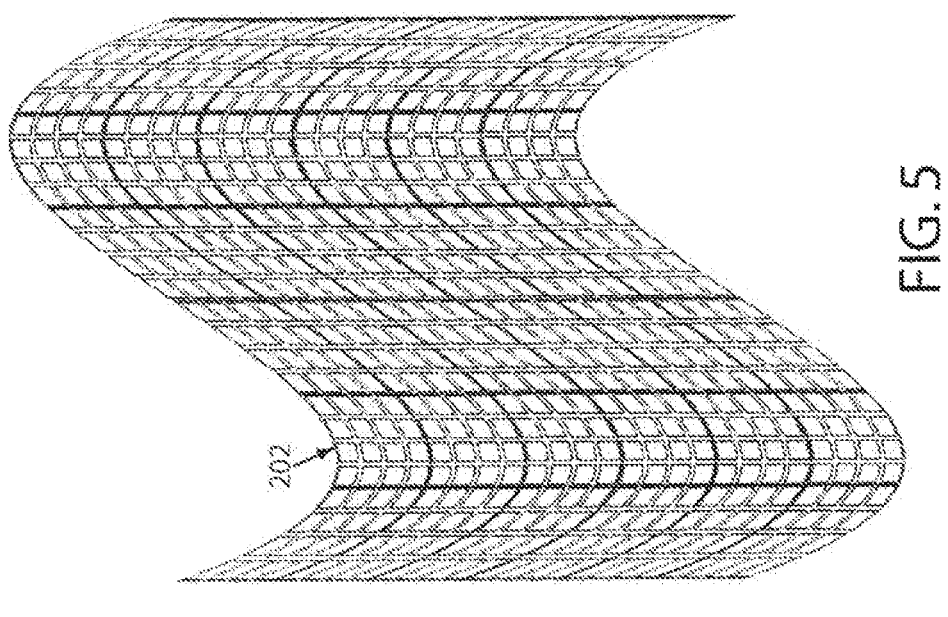
FIG. 5 shows a flexible display which incorporates square-shaped chixels in accordance with an exemplary embodiment of the invention.
Figure 6:
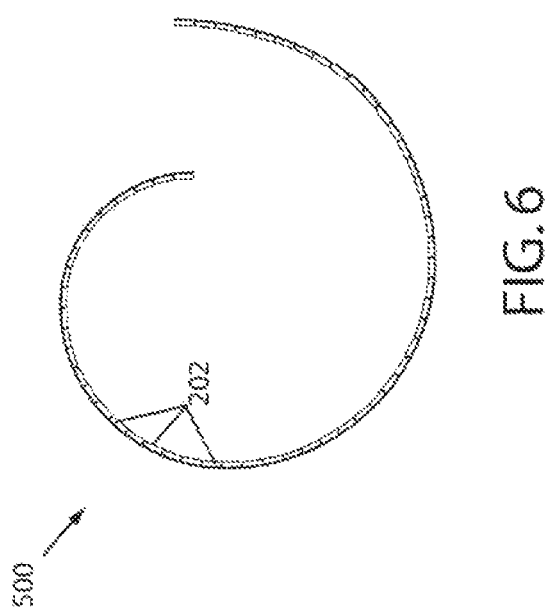
FIG. 6 shows a flexible display which incorporates square-shaped chixels of FIG. 5.

As shown in an exemplary embodiment in FIG. 4, a chixel 202 may be generally square in shape. For example, the chixel may comprise a 4×4 array of 16 pixels 204, each pixel having three sub-pixels 206. As shown in FIG. 5, this square shape allows a chixel-based display 500 in which the chixels 206 are incorporated to flex easily both horizontally and vertically between the chixels 202 as the ratio of vertical and horizontal chixels gaps 304 is the same. FIG. 6 shows a chixel display having chixels 202 on a flexible substrate with sufficient bend radius to be rolled up into a tube having a radius of approximated by:

$$r = \frac{n-\pi}{2\pi}x + \frac{nx}{8\pi x}\sqrt{4x^2 - s^2}$$

Where:
x=width of a chixel;
s=width of space between chixels; and
n=number of chixels in the tube; and
provided that n≥4; x≥0.5 s, and assuming the tube cross-section is circular.

Chixels 202 may be provided in other shapes and arranged to provide a chixel gap 304 of an appropriate size to provide the display 100 with a desired amount of flexibility. Generally, the smaller the chixel 202, the greater the number of chixel gaps 304 in the display in which the chixels are incorporated and the greater the number of bending points that can be provided and, therefore, the greater the flexibility of the display. For example, if it is desirable to provide a greater amount of flexibility in one direction of the substrate than another then the chixels can be shaped to provide such flexibility by arranging a larger number of flexible gaps in the one direction than the other.

Figure 8:
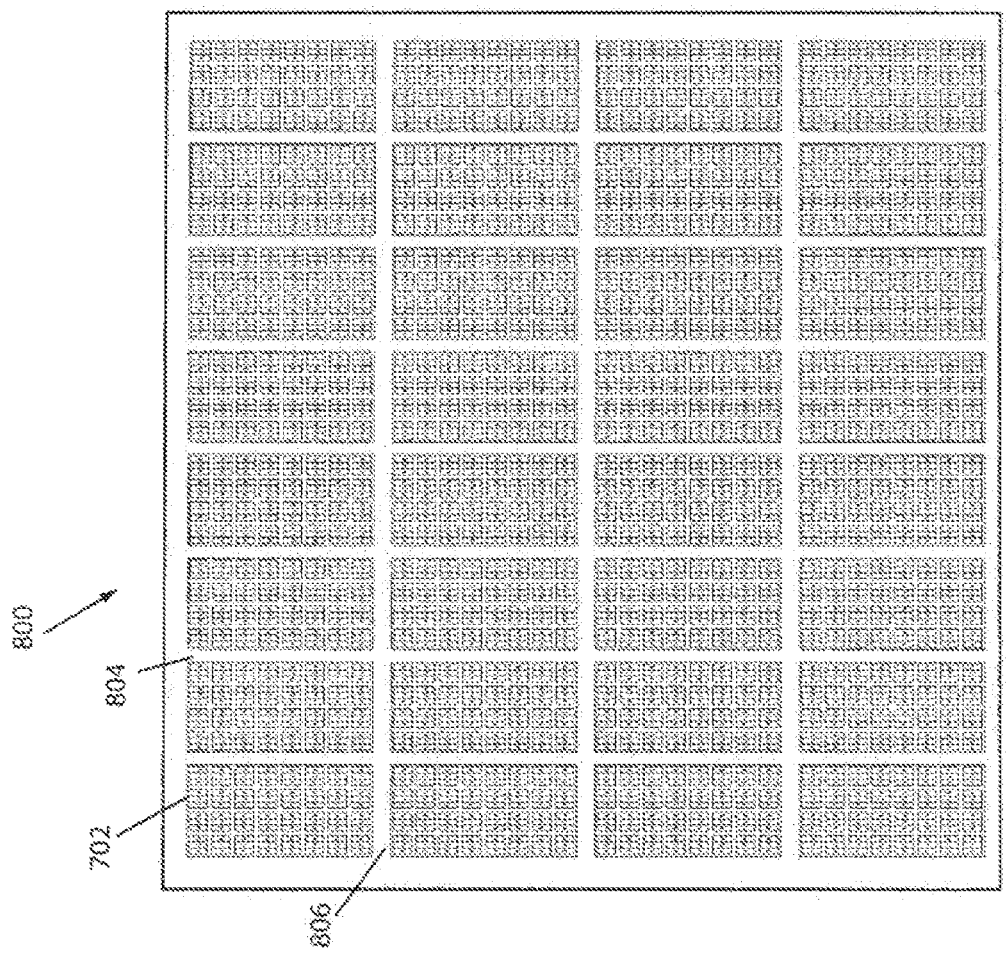
FIG. 8 shows a flexible display incorporating the elongated chixels of FIG. 7.
Figure 7:
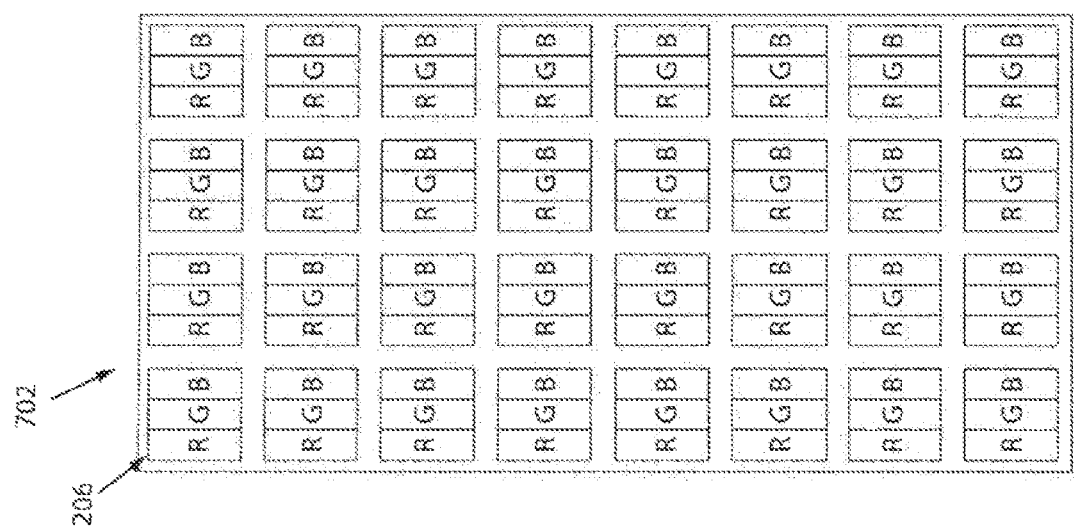
FIG. 7 shows an elongated chixel in accordance with an exemplary embodiment of the invention.
Figure 10:
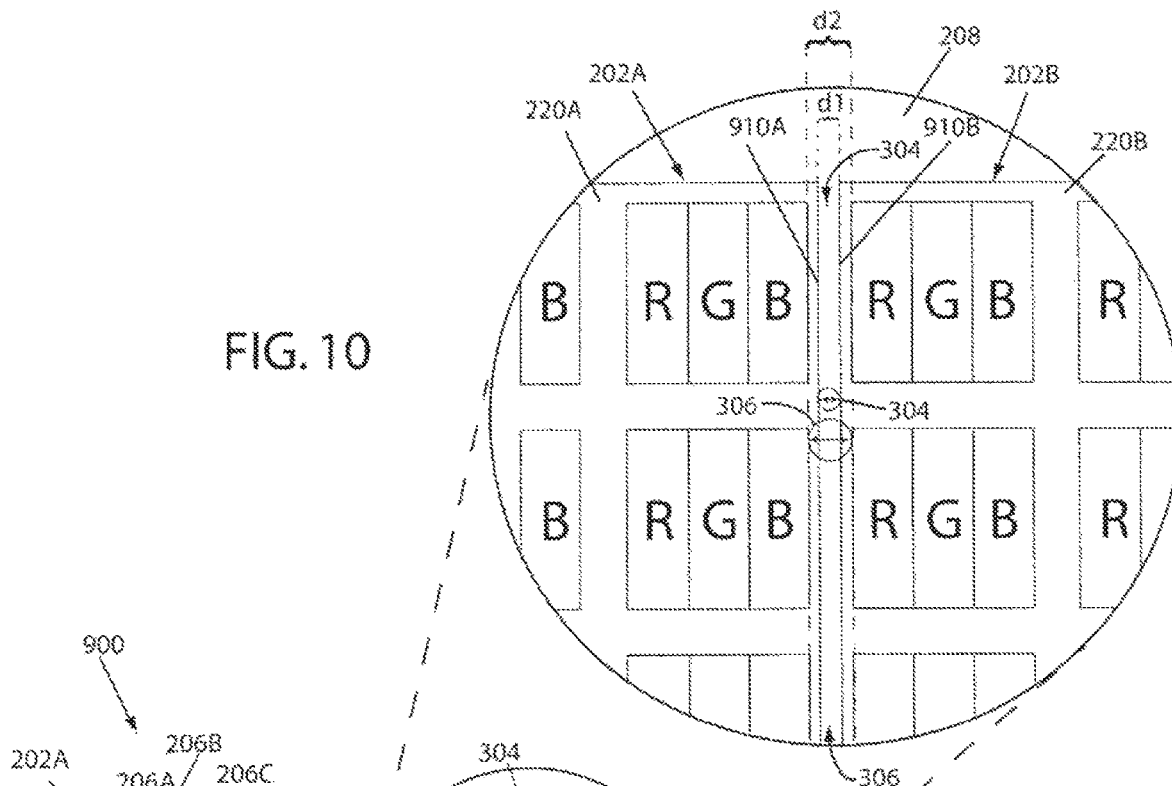
FIG. 10 shows an enlarged portion of the chixel-based arrangement of FIG. 9.

The chixel 702 shown in FIG. 7 includes a 4×8 pixel arrangement. As shown in FIG. 8, this allows for greater lateral bending because there are approximately twice as many vertical bending points 804 in the display than horizontal bending 806 points. Although the smaller the chixel, the greater the number of chixel gaps and the greater the flexibility of the display, the fewer the number of pixels that can be provided on the chixel and/or the smaller the pixels. Thus, while having smaller chixels increases flexibility, having larger chixels increases the size and/or number of pixels that can be provided on each chixel and decreases the number of chixels that must be attached to the flexible substrate. Thus, smaller chixels could be used in areas of the display with higher flexibility requirements.

As shown in FIG. 4, a chixel 202 may include pixels 204 that are comprised of sub-pixels 206. The sub-pixels 206 may have different properties in order to provide desired properties for the pixel 204 of which they form a part. For example, the pixels 204 may comprise red 206A, green 206B, and blue 206C sub-pixels that together form an RGB pixel. The intensity of the individual sub-pixels 206A, 206B, 206B can be manipulated to provide light having desired characteristics, such as a desired light color or brightness. The sub-pixels 206 may have a rectangular shape so that together they form a square-shaped pixel 204. For example, each sub-pixel may have dimensions of ⅓ mm×1 mm to form a pixel of 1 mm^2. The pixels 204 may be provided in a 4×4 array on a rigid substrate 220 to form a chixel of about 4 mm^2. The substrate 220 may be transparent to allow light emission through the substrate. For example, the substrate may be rigid glass or sapphire as discussed in more detail below.

The pixels 204 may be provided at a distance apart from one another, the distance referred to as a "pixel gap" 304. The size of the pixel gap 304 may vary depending upon the particular light emitting technology used for the sub-pixel 206. For example, some light emitters may require conductors that extend around the edge of the emitter, which prevents the light emitters from directly abutting each other, thereby resulting in large sub-pixel and pixel gaps. For example, Organic Light Emitting Diodes (OLEDS) generally require that current be provided through the front of the display and a contact is commonly arranged to extend around the edge of the OLED, thereby preventing OLEDs from being tightly packed in a display.

One problem with prior art displays is that the pixel gap 304 is of such size that gap lines are visible in the resulting display which is distracting to a viewer and renders an image of poorer quality. This led to prior art attempts to provide front conductors for the pixels. This front conductor approach raises additional problems in producing flexible displays, however, due to the limited flexibility and high resistance values of known transparent front electrodes.

In one aspect of the present invention, the pixels 204 are sized relative to the pixel gap 306 between the pixels 204 such that the pixel gap 306 is less noticeable to an observer. For example, in a prior art OLED device the gaps between pixels that are required for the wrap-around electrodes can result in a pixel gap to pixel area ratio that is readily noticeable to a viewer of the display.

In the present invention, pixels 204 are sized relative to the pixel gap 306 so that the gap line is less noticeable while still providing a desired resolution. For example, in the exemplary embodiment shown in FIG. 4, the pixel gap d2 may be 0.25 mm and the pixel size (width or height) 1 mm to produce a pixel gap to pixel size ratio of 0.25 mm/1 mm=0.25. Applicant has found that for a 120" display at 1080p a pixel size of 1 mm^2 is desirable.

One advantage of the present invention is that if a 4 mm chixel 202 which includes 16 pixels in a 4×4 array is used to provide the pixels for the display, the number of operations to provide the pixels 204 to the display is 1/16 of that of a technique that attempts to attach individual pixels to a display because multiple pixels are added with a single chixel. As discussed in more detail below, minimizing the effect of the gap line allows for the use of manufacturing techniques and resulting structures that were previously avoided due to concerns over gap lines. For example, by adjusting the pixel size to the pixel gap to minimize the effect of a gap line allows for electrodes to extend around the side of a pixel and allow a display to be driven at the rear, thereby eliminating some of the problems with prior art devices that are front driven.

Figure 9:
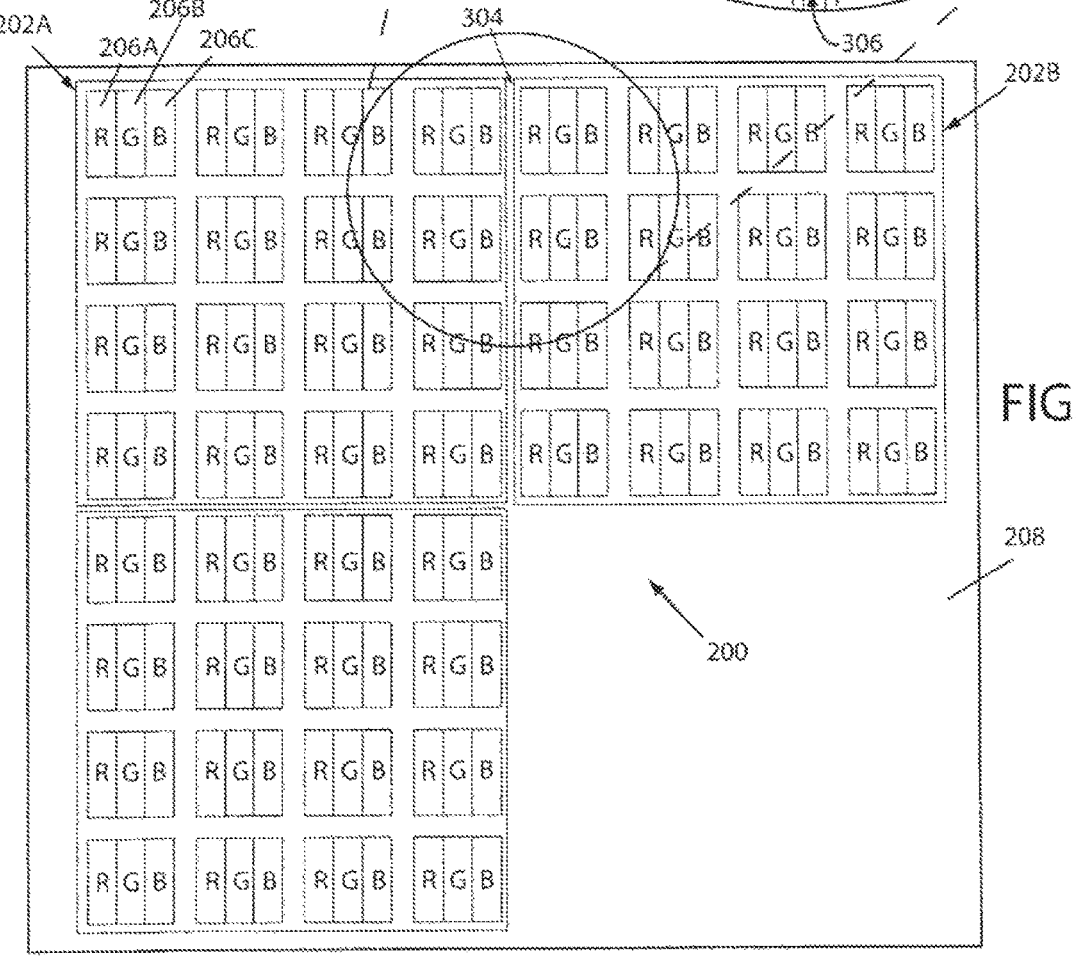
FIG. 9 shows a chixel-based display in accordance with an exemplary embodiment of the invention.

As shown in FIG. 9, chixels 202 may be coupled to a flexible display substrate 208 by an adhesive or other coupling means. The pixels 204 can be arranged on the chixel 202 with uniform pixel spacing of a pitch or pixel gap d2. The chixels 202 can be arranged on the flexible display substrate 208, to maintain the uniform pixel gap 304 d2 between adjacent chixels 202A, 202B. For example, the pixels 202 may be located near the edges 910A-B of the chixels 202 and adjacent chixels 202A-B arranged so that the pixel gap 306 is uniform between pixels 204 even across adjacent chixels 202A, 202B. As discussed above, the chixel gap 304 between the chixels 202 provides a desired bend radius to the flexible substrate 208 that allows the display 100 to flex. Thus, a uniform pixel gap and a desired flexibility can be obtained; in other words the pixel pitch is consistent in both the rows and columns, even between pixels on the edges of two adjacent chixels. In one exemplary embodiment the pixel gap may be 320 micron, the chixel gap 320 micron and the pixel size 1600 micron.

As discussed in more detail below, the flexible substrate 208 may comprise a variety of layers, such as by way of example and not limitation, a contrast layer, a diffusion layer, a filter layer, and an anti-reflection layer. Each of these layers may be of a flexible plastic type. Thus, even though the chixels 202 themselves may be rigid, a sufficient number of chixel gaps 304 are provided in an appropriate arrangement that a desired bend radius of the flexible substrate 208 is obtained.

Figure 11:
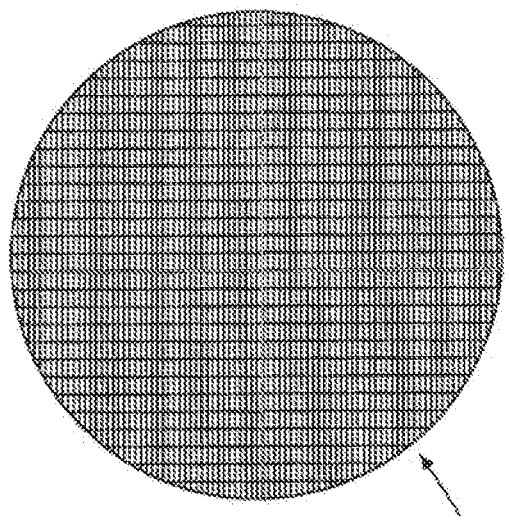
FIG. 11 shows an LED wafer in accordance with an exemplary embodiment of the invention.
Figure 12:
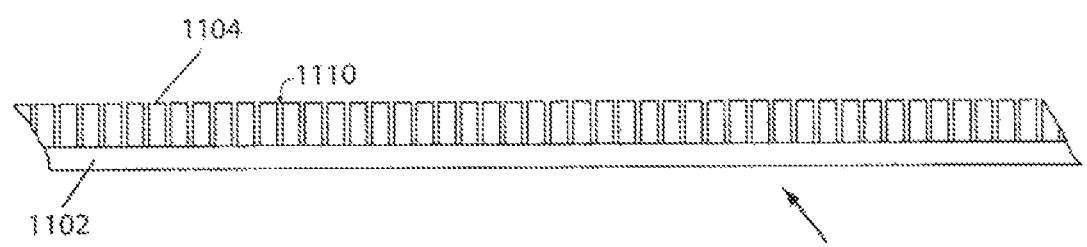
FIG. 12 shows a side view of the wafer of FIG. 11.
Figure 13:
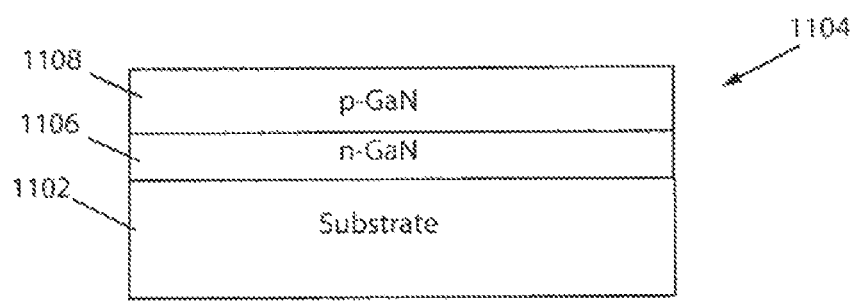
FIG. 13 shows an LED stack of the wafer of FIG. 11.
Figure 15:
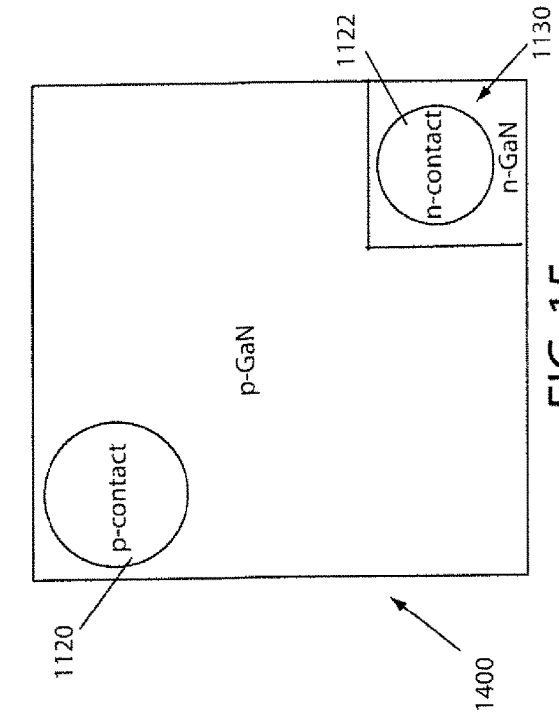
FIG. 15 shows a top view of the LED of FIG. 14.

Chixels 202 may employ different light emitting technologies, such as LED, electro-luminescence, plasma tubes or cells, and backlit LCD. FIGS. 11 and 12 show an exemplary method of manufacturing an LED-based chixel. An LED is formed by depositing an n-doped semiconductor and a p-doped semiconductor layer on a substrate. Light is formed at the p-n junction when it is excited by electrical current. As shown in FIG. 11 an LED wafer 1100 may be produced that includes a plurality of spaced apart LED stacks 1104 that, as discussed in more detail below, may serve as light emitters for a flexible display. As shown in FIG. 12 the LED wafer 1100 may comprise a rigid substrate 1102 having a plurality of LED stacks 1104 thereon. For example, as shown in FIG. 13 an LED stack 1104 may include a p-doped layer 1106 and an n-doped layer 1108 that are provided atop a sapphire substrate 1102 and have the appropriate properties to emit light when supplied with an appropriate charge (current).

Various techniques can be used to create the LED stacks with great accuracy. Portions of the layers 1106, 1108 may be removed to create separate LED stacks on the rigid substrate separated from one another by a gap 1110 that generally corresponds to a sub-pixel or pixel gap of a completed display. For example, a mask may be applied and etching techniques used to etch channels through the upper layers 1106, 1108 down to the substrate to produce stacks that share a common substrate 1102. In an exemplary embodiment LED stacks may be generally square having a length of about 320 um and a width of about 320 um and a gap between the LED stacks 1104 of about 50 um. Applicant has found that a layer of n-GaN of about 0.2 um thickness and a p-GaN layer of about a 0.2 um thickness on a sapphire substrate of a thickness of about 350 um can be used to produce LEDs that emit blue light having a wavelength of about 450 nm. Different layers may be used or additional layers added to the LED stacks to obtain LEDs that emit light with desired characteristics. Furthermore, as discussed in more detail below, filters, photoconverters, and other apparatus may be used to manipulate the light emitted from the LEDs.

Figure 17:
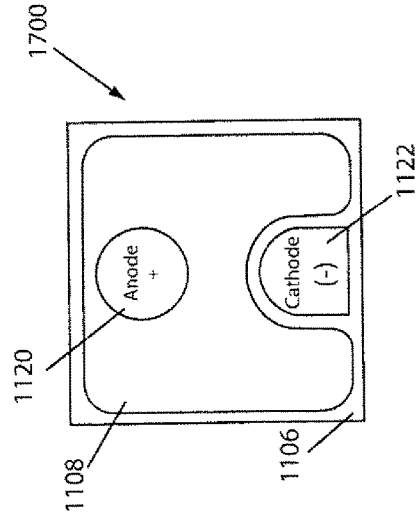
FIG. 17 shows an alternative embodiment of a chixel LED.
Figure 14:
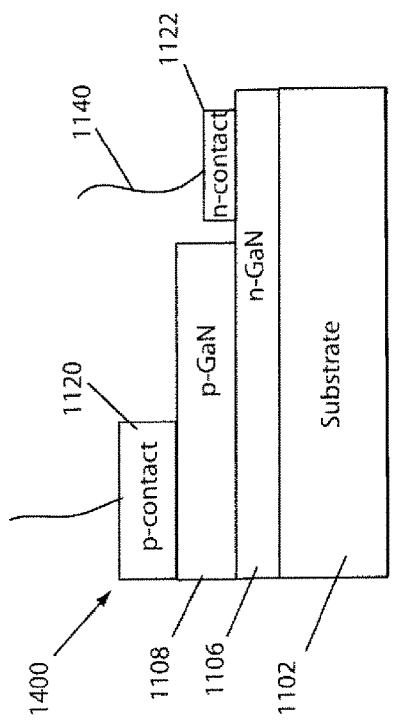
FIG. 14 shows a side view of an LED of a chixel in accordance with an exemplary embodiment of the invention.

In order to make the LED stacks 1104 into workable LEDs, a p-contact 1120 and an n-contact 1122 may be provided to the stacks 1104 as shown in FIG. 14 to form an LED 1400. The p-contact 1120 may be provided in a cutout area 1130 of the p-doped layer 1108. For example, an etching process may be used to remove a portion of the p-doped layer to allow the n-contact 1122 to be placed directly on top of the n-doped layer 1106. This allows the p-contact to be placed directly atop of the n-doped layer 1106 and conductors 1140 to extend upward from the LED to a rear mounted display driver when the LEDs are incorporated into a display. This obviates the need of providing a large space between the light emitters for providing a pathway for conductors running along the edge and side of the light emitter and thereby allows the LEDs to be tightly packed. The wafer may be processed by etching, ablation, or other known techniques to form LEDs of various shapes, such as the LED 1700 shown in FIG. 17 and arranged in a desired arrangement.

Figure 16:
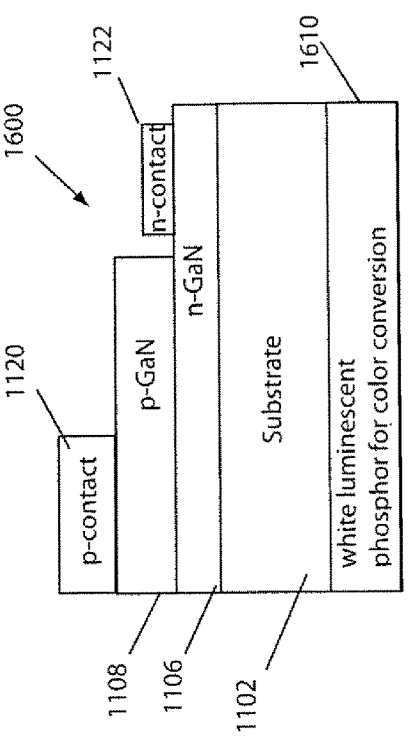
FIG. 16 shows a white light emitting LED of a chixel in accordance with an exemplary embodiment of the invention.

Additional layers can also be added to the LEDs 1400. For example, as shown in an exemplary LED 1600 in FIG. 16 a luminescent phosphor layer 1610, typically a powder phosphor formulated based on the light output of the LED to provide the best conversion, may be provided for color conversion, to convert the emitted blue light to white. The color conversion layer 1610 may be added by known techniques. As shown in FIGS. 14 and 16 when all appropriate current is applied, light is transmitted downwardly from the LED 1400, 1600. Thus, in these embodiments the substrate 1102 is transmissive.

The wafer 1100 may include different layers on different LED stacks to provide different light characteristics. For example, different layers could be used to produce red, blue, and green light from different LED stacks 1104. The wafer 1100 could also be made of uniform LED stacks 1104 having the same or similar properties. For example, the LED stacks 1104 could be constructed to emit white light or blue light which could then be filtered to produce light with desired characteristics. In the exemplary embodiment shown in FIG. 14 in which GaN layers are used, blue light is emitted. Filters may also be used to provide red, green and blue LEDs which could define red, green and blue sub-pixels of an RGB pixel display. As seen in FIG. 16 a white phosphor photo-conversion layer 1610 can be applied so that the light emitted from the LED 1600 is white which is more efficiently filtered than blue light.

As shown in FIGS. 18A-B an LED wafer 1800 may include an array of uniformly spaced rectangular-shaped LEDs 1802. The LEDs 1802 define sub-pixels 1803 that may be incorporated into a flexible display. The sub-pixels 1803 are spaced apart a horizontal distance hl that forms a sub-pixel gap 1808. A group of LEDs, such as three LEDs, may be used to define an addressable pixel 1804 for a display. A larger array of LEDs may define a chixel 1806 which may include multiple sub-pixels and pixels. In the exemplary embodiment shown in FIG. 19 the chixel 1806 includes 8 rows of 12 LEDs which define 96 sub-pixels and 32 three-LED pixels 1804 of the chixel 1806 to provide a 4×8 pixel arrangement. Commands/instruct ions from a driver may be directed to the LEDs of the pixel grouping to manipulate the individual LEDs 1802 as sub-pixels so that the overall light produced by the pixel 1804 is of desired characteristics, such as a desired color and brightness.

Multiple chixels 1806 may be coupled to a flexible substrate 208 to form a flexible display 2000. For example, as shown in FIG. 20 chixels 1806 may be coupled to a flexible substrate 208 in an arrangement 2202. The arrangement of the sub-pixels 1803 on the individual chixel 1806 in conjunction with the arrangement of the chixels 1806 on the substrate 208 may be such as to provide uniform LED spacing and hence uniform sub-pixel and pixel spacing across the display 100. In addition, the pixel gap 306 may be uniform across the display and may be set equal to the pixel gap 308. By providing the sub-pixels 1802 about the edge of the chixel 1806, and removing a predetermined amount of the substrate 208 in the dicing process, the chixel gap 304 may be such that the pixel gap 306 between pixels on adjacent chixels 202 is the same as the pixel gap between pixels on the same chixel and the pixel gap is equal to the subpixel gap. This provides for a uniform display with minimal gap lines. While discussed primarily in terms of the lateral spacing of the sub-pixels, pixels, and chixels, the same principles apply to the spacing of the sub-pixels, pixels, and chixels in other directions, such as the vertical gaps.

The size of the pixels 1804 can be varied depending upon the desired resolution and use of the display. For example, the size of the sub-pixels and pixels 1804 within a chixel 1806 incorporated into a display intended for use at a viewing distance of 10 feet may be smaller than a display meant to be used at a viewing distance of 100 feet, even though the displays have the same resolution.

As discussed above, the chixels 202 may be coupled to a flexible substrate 208 to form a flexible display 100. In addition to providing support to the chixels 202 the substrate 208 may also provide additional functions, such as filtering, light diffusion, contrast enhancement, etc., and may be comprised of multiple layers. An exemplary flexible substrate 2200 shown in FIG. 22 comprises a diffusion layer 2202, a contrast enhancement layer 2204, and an outer protective layer 2206. The flexible substrate 2200 may also include an adhesive layer 2208 for coupling chixels 202 to the flexible substrate 2200 and one or more filters 22 1 0, as well as an anti-reflective layer 2212 (not shown).

Figure 23:
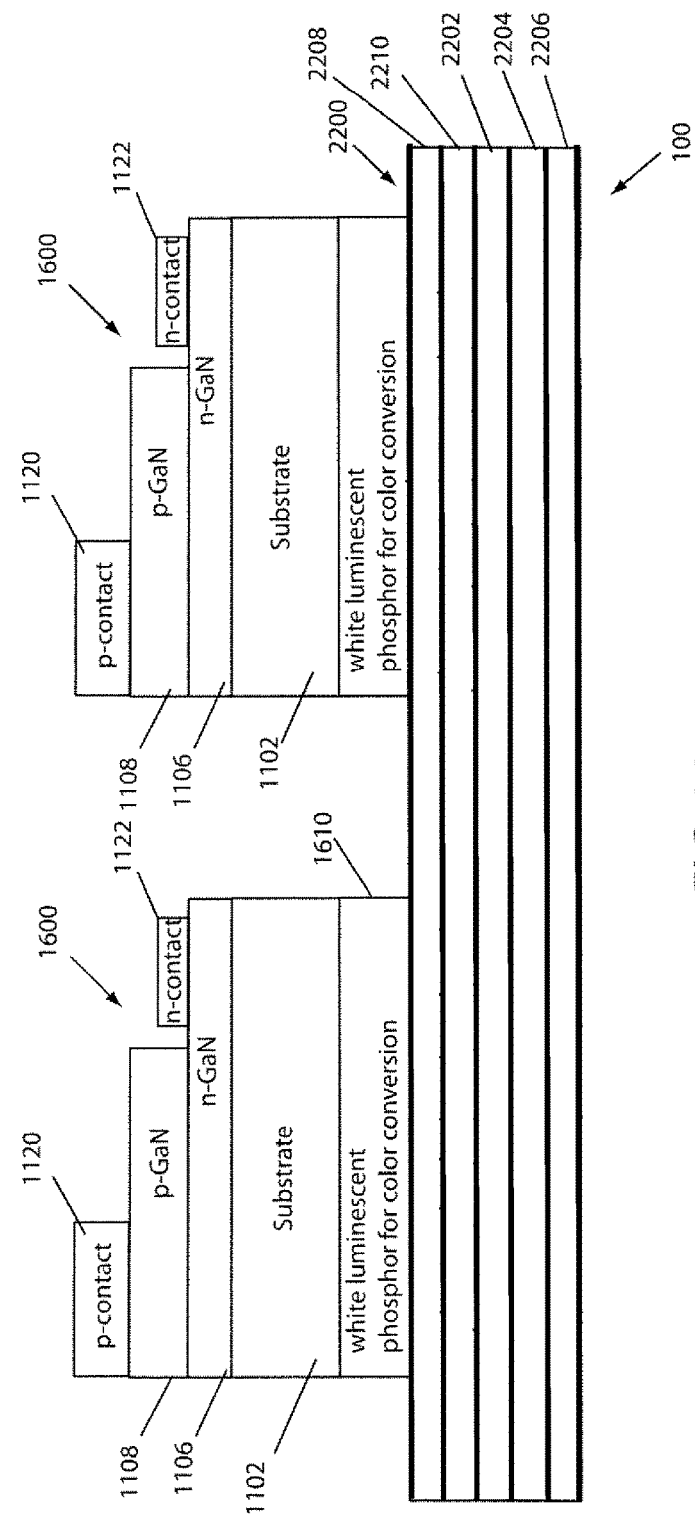
FIG. 23 shows a side view of a chixel-based display.

The chixels 1600 may be placed light-emitting end down on the substrate 208 as shown in FIG. 23 so as to emit light through the flexible substrate 2200. The exposed p 1120 and n 1122 contacts allow the display to be driven from the rear by a drive system 2402 as shown in FIG. 23, thereby avoiding the complications of providing transparent front electrodes to the LED sub-pixels. As discussed above with reference to FIGS. 3A-3B the chixels 1600 are arranged on the substrate 2200 so that the resulting chixel gaps 304 provide sufficient bending areas to give the substrate 2200 a desired amount of flexibility. The drive means may address the sub-pixels in predetermined pixel groupings.

Figure 22:
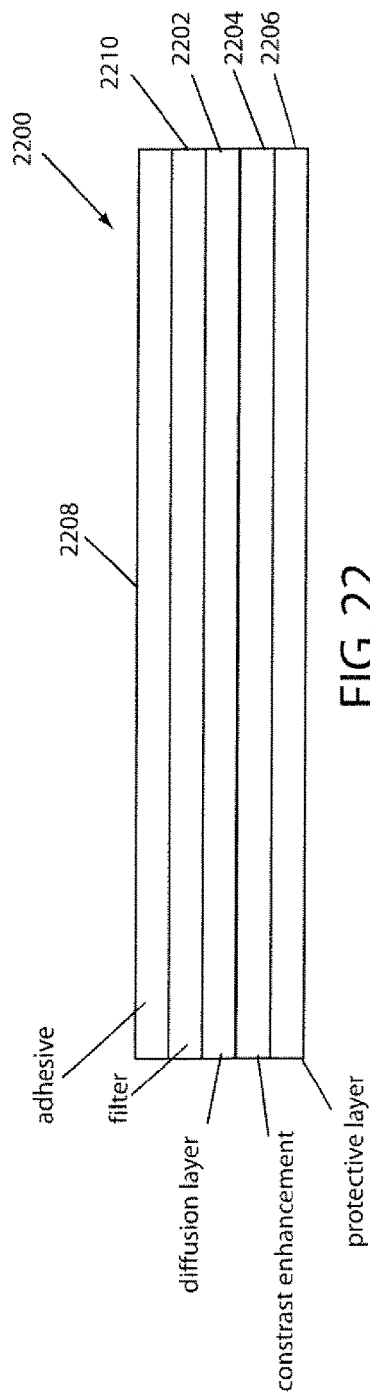
FIG. 22 shows a display substrate in accordance with an exemplary embodiment of the invention.
Figure 26:
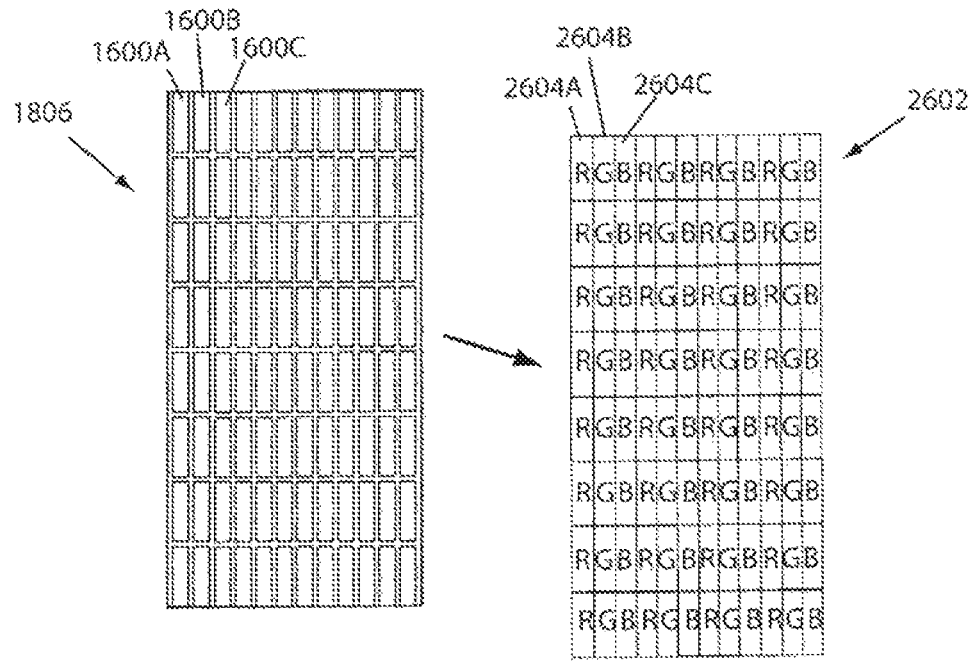
FIG. 26 shows a chixel and filter arrangement for a chixel-based display in accordance with an exemplary embodiment of the invention.
Figure 27:
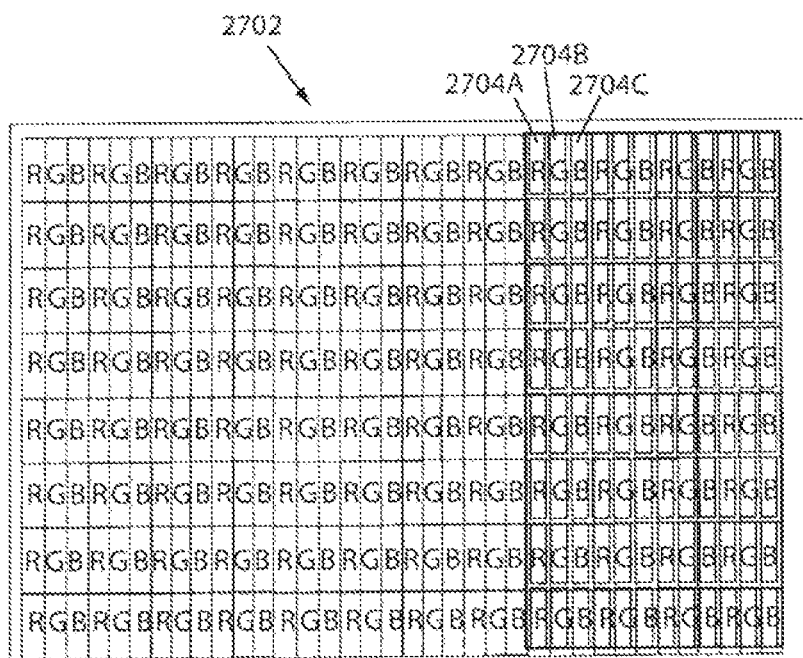
FIG. 27 a chixel-based display incorporating the chixel and filter of FIG. 26.

As shown in FIG. 22 the substrate may be provided with one or more filters 2210 to manipulate the light emitted from the LED light emitters. For example, an array of color filters can be printed, sprayed or otherwise provided to the substrate 2200. As seen in FIG. 26 a red-green-blue filter arrangement 2602 having filter portions 2604A, 2604B, 2604C of red R, green G and blue B may be added to the substrate assembly 2200 to form a filtered substrate 2702 with filter portions 2604 that correspond with the different LED light emitters 1600A, 1600B, 1600C of a chixel 1600. The chixel 1600 is coupled to the filtered substrate to form a color display 2700 so that the light emitters 1600 align with the filtered portions 2604 to form RGB pixels 2702A, 2702B, 2702C as shown in FIG. 27.

Figure 24:
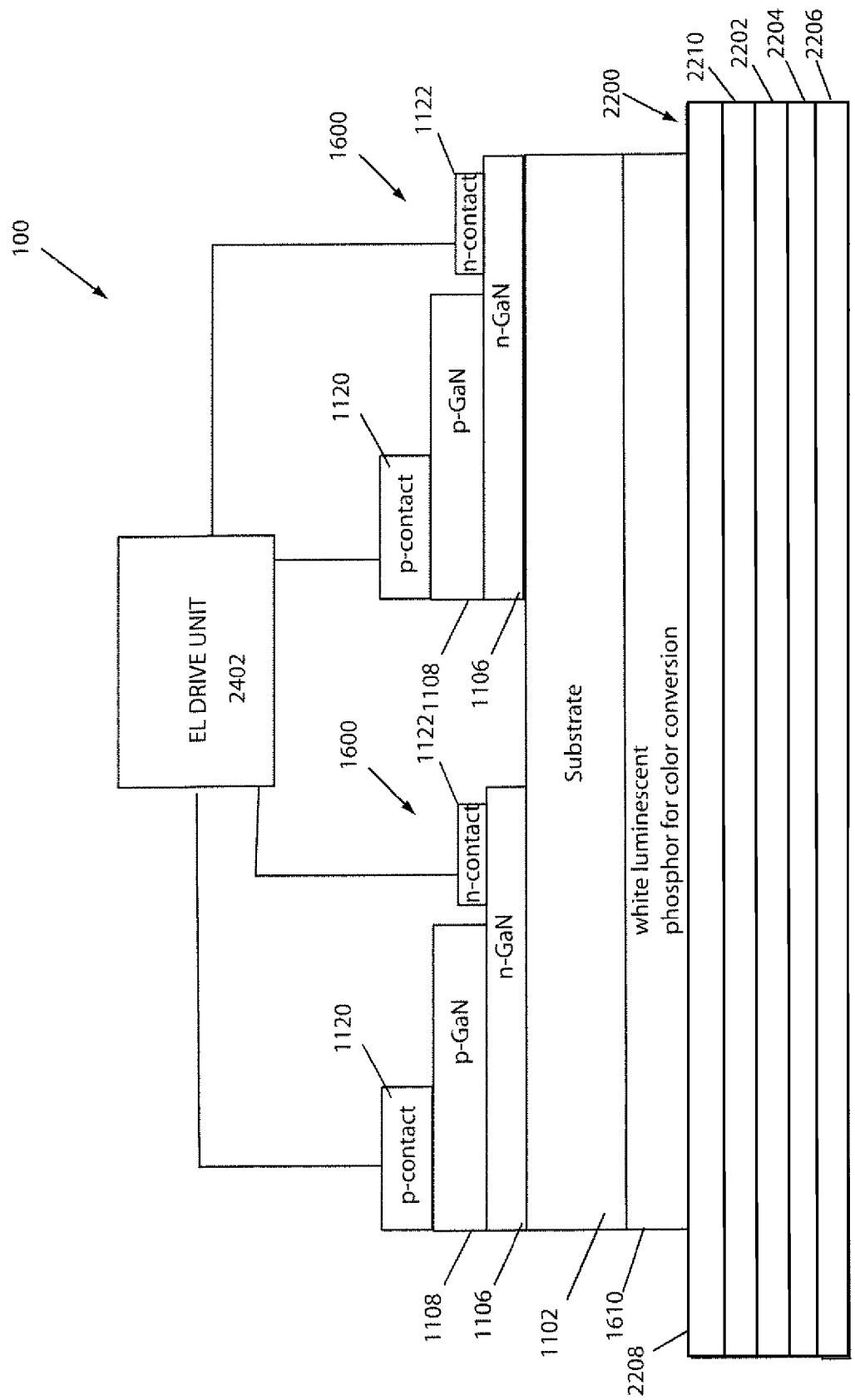
FIG. 24 shows a flexible chixel-based display in accordance with an exemplary embodiment of the invent ion.
Figure 25:
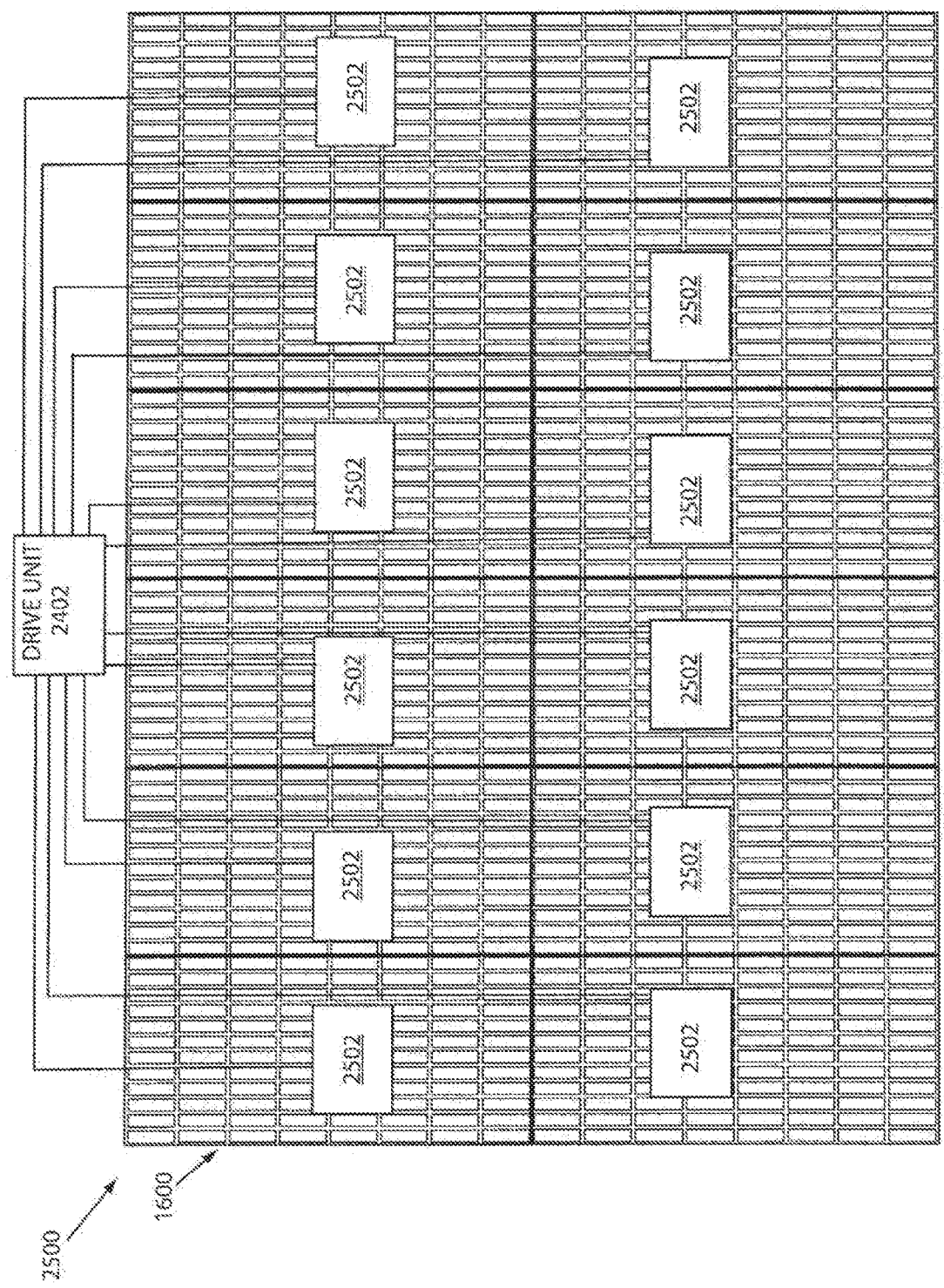
FIG. 25 shows a flexible chixel-based display having dedicated controllers for each chixel.

As shown in FIG. 24 drive means 2402 may be provided to the chixels to provide the necessary power and commands to make the light emitters of the chixels emit light in a desired manner. The drive means 2402 may include drive electronics as known in the art. In the exemplary embodiment shown in FIG. 25, a controller 2502 is provided for each chixel. The controller 2502 may comprise a data line and a power line that controls the emission of light from each of the light emitters on a particular chixel 1600. By providing individual chixels with a controller 2502, chixel units can be provided which can be pre-made and ready to install in a display.

Other filter arrangements may be provided in lieu of the standard RGB filter arrangement discussed above, in which each filter covers a single light emitter. For example, in the exemplary embodiment shown in FIGS. 28-30 edge filters 2804 are arranged horizontally to cover portions of more than one light emitter. These edge filters further minimize the effect of the chixel gaps 304. In addition, the chixels may be sized to include edge light emitters in addition to standard three sub-pixel multiples.

Chixel gaps may to be more noticeable when the display 100 is flexed into a non-flat condition. As shown in FIG. 28 in addition to the standard lateral RGB filter arrangement of the filter arrangement 2602 in FIG. 26, the filters that correspond to light emitters 1600 at the outer edge of a chixel 2802 referred to as edge emitters 2810 may be sized and shaped to cover edge emitters of two adjacent chixels 2802. For example, edge filters 2804 may be provided to bridge the chixel gap 304 between adjacent chixels 2802 and cover edge light emitters 2810 on each chixel 2802. These edge filters 2804 may be oriented horizontally and may be of a size as to together cover an edge light emitter 2810 on adjacent chixels 2802 in a vertical RGB arrangement. For example, as shown in FIG. 28 a row of 14 light emitters 1600 on a chixel 2802 include 12 center light emitters and two edge emitters 28 10. The chixel 2802 may be arranged on a filtered substrate 2906 having vertical filter portions 2604 and edge filters 2804 so that the center 12 light emitters 1600 correspond with a row of 12 vertically oriented red 2604A, green 2604B or blue 2604C filters and the two edge light emitters 2810 correspond with colored edge filters 2804A-C.

Instead of covering a single light emitter on one chixel, the edge filter are sized and oriented to cover all edge light emitter 2810 on each chixel thereby bridging the chixel gap. In addition, the edge filters may be of a size such that multiple edge filters cover the adjacent light emitters. For example, red, green and blue edge filters may be arranged to cover adjacent edge light emitters in a vertical RGB pattern. The same may be done along the upper and lower edges of adjacent chixels. In addition to having the 12 RGB filters which correspond to 4 RGB pixels, an extra light emitter may be provided at each edge of the chixel to form a row of 14 light emitters. Thus, when two chixels are placed next to one another two edge pixels/light emitters are adjacent one another. It should be noted that while the sub-pixels and filters are generally discussed as corresponding with a single light emitter, filters may cover multiple light emitters. For example, a sub-pixel of a chixel could include three vertically aligned light emitters which could be cover by a red filter to define a red sub-pixel.

Figures 31, 32:
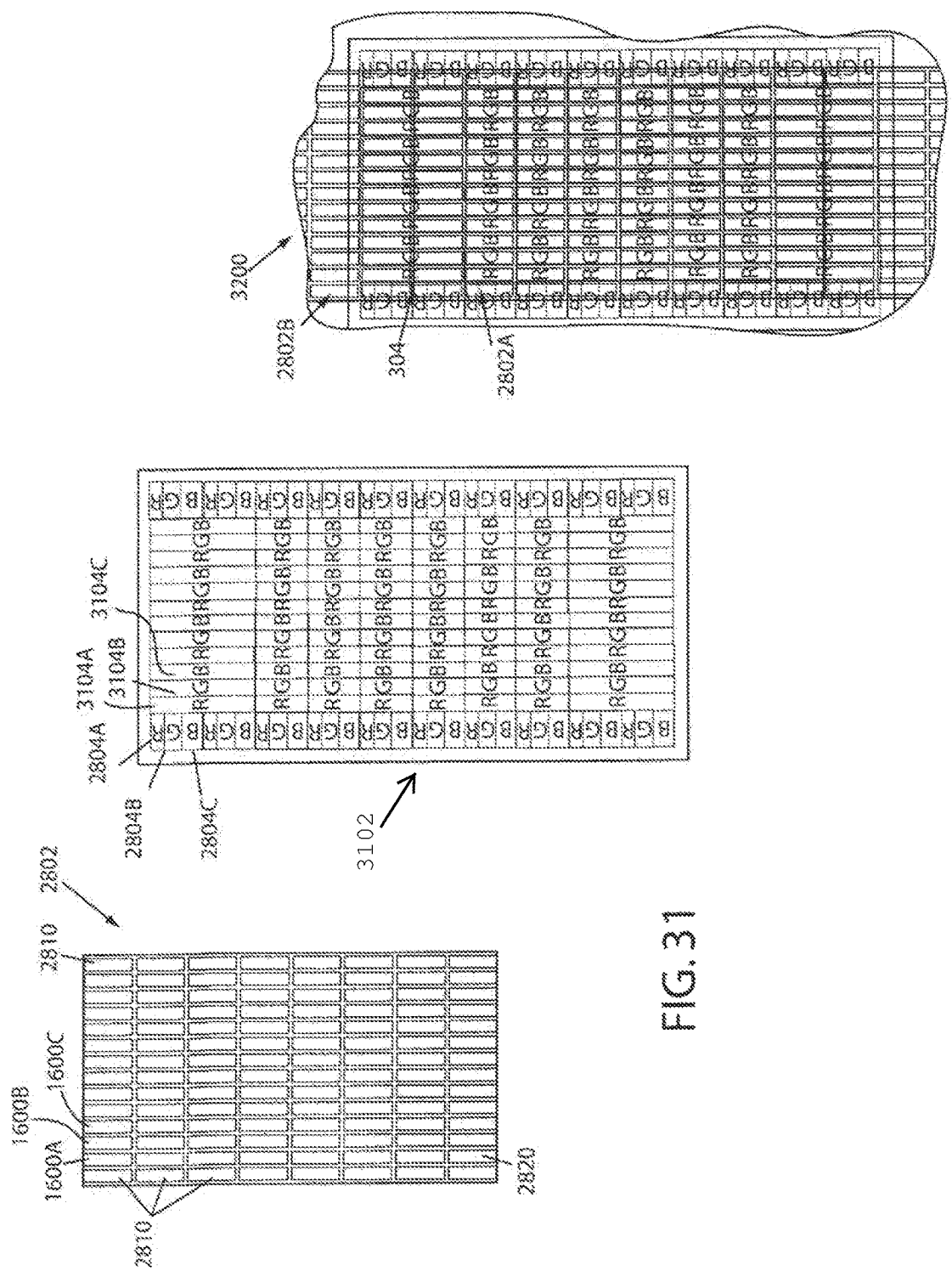
FIG. 31 shows an exemplary embodiment of filter pattern.
FIG. 32 shows an exemplary chixel and filter arrangement.

FIG. 31 shows another exemplary filter pattern 3102 that may be used in conjunction with a chixel 2802 in which upper and lower end filters 3104 are elongated to filter adjacent upper and lower light emitters 2820 across the chixel gap 304 in FIG. 32. Although each upper edge filter 3104 is shown as a single color filter that covers two adjacent light emitters from adjacent chixels 2802A-B, the filters could be sized so that each light emitter is covered by a red, green, and blue filter.

What is claimed is:

1. A flexible light emitting display apparatus comprising:
   (a) a plurality of light emitting rigid chixels affixed to a flexible substrate, said plurality of light emitting rigid chixels collectively providing a visible display, said display having both vertical and horizontal directions defined in the plane of said visible display;
   (b) each of said plurality of light emitting rigid chixels comprising:
      i. one or more light emitting pixels coupled to a rigid substrate, said rigid substrate having a contiguous non-functional edge at the perimeter of the light emitting rigid chixel and an adjacent region devoid of any conductor;
      ii. each of said one or more light emitting pixels comprising a plurality of light emitting sub-pixels coupled to said substrate to provide a spaced array of sub-pixels providing a plurality of sub-pixel gaps between adjacent light emitting sub-pixels in a vertical direction;
      iii. each of said light emitting pixel further characterized in that more than one color of light may be produced by said light emitting pixel;
      iv. said plurality of light emitting sub-pixels disposed in a linear arrangement with respect to each other when viewed on said visible display, the direction of said linear arrangement being parallel to said vertical direction;
      v. wherein one of said plurality of light emitting sub-pixels is a top sub-pixel disposed at a terminus of said linear arrangement, and wherein one of said plurality of light emitting sub-pixels is a bottom sub-pixel disposed at another terminus of said linear arrangement;
   (c) said plurality of light emitting rigid chixels arranged upon said substrate to provide a spaced array of chixels, said spaced array of chixels providing a plurality of substantially equal first pixel gaps disposed across said non-functional edges between the top sub-pixel of each adjacent light emitting chixel in both said horizontal and said vertical directions;
   (d) said spaced array of chixels further providing a plurality of substantially equal second pixel gaps disposed across said non-functional edges between the bottom sub-pixel of each adjacent light emitting pixel in both said horizontal and said vertical directions;
   (e) further characterized in that each of said plurality of first pixel gaps is substantially equal to each of said plurality of said second pixel gaps across said display;
   (f) said spaced array of chixels further configured to provide a plurality of bend gaps between adjacent chixels, said plurality of bend gaps allowing bending of said flexible substrate.

2. The apparatus of claim 1, further characterized in that each of said plurality of light emitting rigid chixels is disposed upon said flexible substrate such that the non-functional edge of any light emitting rigid chixel does not overlap the non-functional edge of any adjacent light emitting rigid chixel.

3. The apparatus of claim 1, further characterized in that the rigid substrate of each of said plurality of light emitting rigid chixels is substantially transparent and at least a portion of the light emitted by said light emitting rigid chixel is transmitted through said rigid substrate.

4. The apparatus of claim 1, further characterized in that a portion of said plurality of light emitting rigid chixels is disposed upon said flexible substrate such that the non-functional edge of at least one light emitting rigid chixel abuts the non-functional edge of an adjacent light emitting rigid chixel.

5. The apparatus of claim 1, further characterized in that said one or more light emitting pixels is a plurality of light emitting pixels coupled to said rigid substrate, a first portion of said plurality of light emitting pixels effective to produce a red light emission, a second portion of said plurality of light emitting pixels effective to produce a green light emission, and a third portion of said plurality of light emitting pixels effective to produce a blue light emission.

6. The apparatus of claim 5 further characterized in that a fourth portion of said plurality of light emitting pixels is effective to produce a substantially white light emission.

7. The apparatus of claim 1, further characterized in that a first portion of said plurality of sub-pixels is effective to produce a red light emission, a second portion of said plurality of sub-pixels is effective to produce a green light emission, and a third portion of said plurality of sub-pixels is effective to produce a blue light emission.

8. The apparatus of claim 7 further characterized in that a fourth portion of said plurality of sub-pixels is effective to produce a substantially white light emission.

9. The apparatus of claim 1, further characterized in that each of said plurality of light emitting rigid chixels consists of one pixel.

10. The apparatus of claim 1, further characterized in that each of said plurality of light emitting rigid chixels consists of one pixel, and, each pixel consists of: a red light emitting sub-pixel, a green light emitting sub-pixel, and, a blue light emitting sub pixel.

11. A method of constructing a flexible light emitting display module, the method comprising the steps of:
   (a) providing a plurality of light emitting rigid chixels, each chixel comprising:
      i. one or more light emitting pixels coupled to a rigid substrate, each of the plurality having a contiguous non-functional edge at the perimeter of the light emitting rigid chixel and an adjacent region devoid of any conductor;
      ii. each of said one or more light emitting pixels comprising a plurality of light emitting sub-pixels coupled to said rigid substrate to provide a spaced array of sub-pixels providing a plurality of sub-pixel gaps between adjacent light emitting sub-pixels in a vertical direction;

iii. said plurality of light emitting sub-pixels comprising each of said light emitting pixel further characterized in that more than one color of light may be produced by said light emitting pixel;
iv. said plurality of light emitting sub-pixels disposed in a linear arrangement with respect to each other when viewed on said visible display, the direction of said linear arrangement being parallel to said vertical direction;
v. wherein one of said plurality of light emitting sub-pixels is a top sub-pixel disposed at a terminus of said linear arrangement, and wherein one of said plurality of light emitting sub-pixels is a bottom sub-pixel disposed at another terminus of said linear arrangement;
(b) affixing said plurality of light emitting rigid chixels to a flexible substrate in an arrangement that collectively provides a visible display having both horizontal and vertical directions in the plane of said visible display;
(c) spacing said plurality of light emitting rigid chixels upon said flexible substrate to provide a first pixel gap disposed across said non-functional edges between the top sub-pixel of each adjacent light emitting rigid chixel in both said horizontal and vertical directions;
(d) spacing said plurality of light emitting rigid chixels upon said flexible substrate to provide a second pixel gap disposed across said non-functional edges between the bottom sub-pixel of each adjacent light emitting rigid chixel in both said horizontal and vertical directions;
(e) spacing said first pixel gap to be substantially equal to said second pixel gap;
(f) spacing said plurality of light emitting rigid chixels to provide a plurality of bend gaps between adjacent chixels, said plurality of bend gaps allowing bending of said flexible substrate.

12. The method of claim 11 additionally comprising the steps of:
(a) disposing each of said plurality of light emitting rigid chixels upon said flexible substrate such that the non-functional edge of any light emitting rigid chixel does not overlap the non-functional edge of any adjacent light emitting rigid chixel.

13. The method of claim 11 additionally comprising the steps of:
(a) providing a substantially transparent rigid substrate for each of said plurality of light emitting rigid chixels in which at least a portion of the light emitted by said light emitting rigid chixel is transmitted through said rigid substrate.

14. The method of claim 11 additionally comprising the steps of:
(a) disposing at least a portion of said plurality of light emitting rigid chixels upon said substrate such that the non-functional edge of at least one light emitting rigid chixel abuts the non-functional edge of an adjacent light emitting rigid chixel.

15. The method of claim 11, the one or more light emitting pixels further characterized as a plurality of light emitting pixels, a first portion of said plurality of light emitting pixels effective to produce a red light emission, a second portion of said plurality of light emitting pixels effective to produce a green light emission, and a third portion of said plurality of light emitting pixels effective to produce a blue light emission.

16. The method of claim 15, further characterized in that a fourth portion of said plurality of light emitting pixels is effective to produce a substantially white light emission.

17. The method of claim 11, the plurality of sub-pixels further characterized in that a first portion of said plurality of sub-pixels is effective to produce a red light emission, a second portion of sub-pixels is effective to produce a green light emission, and a third portion of sub-pixels is effective to produce a blue light emission.

18. The method of claim 17, further characterized in that a fourth portion of sub-pixels is effective to produce a substantially white light emission.

19. The method of claim 11, further characterized in that each of said plurality of light emitting rigid chixels consists of one pixel.

20. The method of claim 11, further characterized in that each of said plurality of light emitting rigid chixels consists of one pixel, each pixel consisting of: a red light emitting sub-pixel, a green light emitting sub-pixel, and, a blue light emitting sub pixel.

* * * * *